United States Patent
Arnold et al.

(10) Patent No.: US 11,923,816 B2
(45) Date of Patent: Mar. 5, 2024

(54) III-NITRIDE POWER SEMICONDUCTOR BASED HETEROJUNCTION DEVICE

(71) Applicant: Cambridge GaN Devices Limited, Cambridgeshire (GB)

(72) Inventors: Martin Arnold, Cambridge (GB); Loizos Efthymiou, Cambridge (GB); Florin Udrea, Cambridge (GB); John William Findlay, Cambridge (GB); Giorgia Longobardi, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 193 days.

(21) Appl. No.: 17/589,660

(22) Filed: Jan. 31, 2022

(65) Prior Publication Data
US 2023/0246615 A1    Aug. 3, 2023

(51) Int. Cl.
*H03F 3/45* (2006.01)
*H01L 29/20* (2006.01)
*H01L 29/778* (2006.01)

(52) U.S. Cl.
CPC ...... *H03F 3/45677* (2013.01); *H01L 29/2003* (2013.01); *H01L 29/778* (2013.01); *H03F 2200/72* (2013.01); *H03F 2200/75* (2013.01)

(58) Field of Classification Search
CPC ............ H03F 3/45677; H03F 2200/72; H03F 2200/75; H03F 3/45475; H03F 3/2173; H01L 29/2003; H01L 29/778; H02M 1/08; H03K 17/18; H03K 17/133; H03K 17/13; H03K 17/136
See application file for complete search history.

(56) References Cited

U.S. PATENT DOCUMENTS

2015/0263100 A1* 9/2015 Deboy .............. H01L 29/42316
327/537

OTHER PUBLICATIONS

Hwang, et al.; "1.6kV, 2.9 mΩ cm2 Normally-off p-GaN HEMT Device", Proceedings of the 2012 24th International Symposium on Power Semiconductor Devices and ICs Jun. 3-7, 2012—Bruges, Belgium.
Kwan, et al.; "CMOS-Compatible GaN-on-Si Field-Effect Transistors for High Voltage Power Applications", Power IC Program, Analog / RF & Specialty Technology Division, TSMC, Hsin-Chu, Taiwan.
Lenci, et al.; "Au-Free AlGaN/GaN Power Diode on 8-in Si Substrate With Gated Edge Termination", IEEE Electron Device Letters, vol. 34, No. 8, Aug. 2013.
Mishra, et al.; "GaN-Based RF Power Devices and Amplifiers", Proceedings of the IEEE, vol. 96, No. 2, Feb. 2008, p. 287-305.
Oka; "AlGaN/GaN Recessed MIS-Gate HFET With High-Threshold-Voltage Normally-Off Operation for Power Electronics Applications", IEEE Electron Device Letters, vol. 29, No. 7, Jul. 2008, pp. 668-670.

(Continued)

*Primary Examiner* — Jung Kim
(74) *Attorney, Agent, or Firm* — TAROLLI, SUNDHEIM, COVELL & TUMMINO L.L.P.

(57) ABSTRACT

An integrated circuit is provided which can sense the drain voltage of an active heterojunction transistor under different conditions and can adjust a driving signal of a gate terminal of the active heterojunction transistor in order to limit conduction losses and/or switching losses.

22 Claims, 22 Drawing Sheets

(56) References Cited

OTHER PUBLICATIONS

Uemoto, et al.; "Gate Injection Transistor (GIT)—A Normally-Off AlGaN/GaN Power Transistor Using Conductivity Modulation", IEEE Transactions on Electron Devices, vol. 54, No. 12, Dec. 2007, pp. 3393-3399.

Saito, et al.; "Recessed-Gate Structure Approach Toward Normally Off High-Voltage AlGaN/GaN HEMT for Power Electronics Applications", IEEE Transactions on Electron Devices, vol. 53, No. 2, Feb. 2006, pp. 356-362.

Cai, et al.; "High-Performance Enhancement-Mode AlGaN/GaN HEMTs Using Fluoride-Based Plasma Treatment", IEEE Electron Device Letters, vol. 26, No. 7, Jul. 2005.

\* cited by examiner

III-NITRIDE POWER SEMICONDUCTOR BASED HETEROJUNCTION DEVICE

BACKGROUND

A power semiconductor device is a semiconductor device used as a switch or rectifier in power electronics (e.g., dc to ac inverter for motor control or dc to dc converter for switched-mode power supplies). A power semiconductor device is usually used in "commutation mode" (i.e., it is either on or off), and therefore has a design optimized for such usage.

In general, a power device has a rated voltage (i.e. the potential difference that the device has to withstand in the off-state between its main terminals) of over 20 V and conducts more than 100 mA during on-state. More commonly the rating of a power device is above 60V and above 1A. These values make the power devices very different from the low power devices, which operate with voltages below 5V and typical currents of under 1 mA and more commonly in the range of μAs or sub μAs. Another differentiation between power devices and other types of devices such as low power or RF, is that they operate mainly with large signals and they behave like switches. An exception to that is found in high voltage or power amplifiers, which use specialised power transistors.

Silicon bipolar junction transistors (BJT), metal-oxide-semiconductor field effect transistors (MOSFET) and insulated gate bipolar transistors (IGBT) are common types of power semiconductor switching devices. Their application areas range from portable consumer electronics, domestic appliances, hybrid and electric cars, motor control and power supplies to RF and microwave circuits and telecommunication systems.

Gallium Nitride (GaN) has recently been introduced as a material in the field of power electronics enabling the development of devices with increased power density, reduced on-resistance, and high frequency response. The wide band gap of the material ($E_g$=3.39 eV) results in high critical electric field ($E_c$=3.3MV/cm) which can lead to the design of devices with a shorter drift region, and therefore lower on-state resistance, if compared to a silicon-based device with the same breakdown voltage [1]. The use of an AlGaN/GaN heterostructure also allows the formation of a two-dimensional electron gas (2DEG) at the hetero-interface where carriers can reach very high mobility ($\mu$=2000 cm$^2$/(Vs)) values [1]. In addition, the piezopolarization charge present at the AlGaN/GaN heterostructure, results in a high electron density in the 2DEG layer (e.g. $1\times10^{13}$ cm$^{-2}$). These properties allow the development of High Electron Mobility Transistors (HEMTs) and Schottky barrier diodes with very competitive performance parameters [2],[3].

However, the 2DEG which inherently exists at the AlGaN/GaN hetero-interface creates a challenge when attempting the design of normally-off rather than normally-on devices. Nonetheless, as normally-off transistors are preferable in most power electronic applications several methods have been proposed which can lead to enhancement mode devices, among them the use of metal insulator semiconductor structures [4], use of fluorine treatment [5], recessed gate structures [6] and use of a p-type cap layer [7][8]. Due to the relative maturity and controllability in the epitaxial growth of pGaN layers compared to the other techniques, pGaN/AlGaN/GaN HEMTs are considered the leading structure for commercialization.

The gate terminal of a pGaN gate HEMT is commonly biased between Vgs=4V and 7V (where Vgs is the gate to source voltage) when the device is in on-state forward conduction mode, while it is either biased at zero volts or a negative voltage when the device is in the off-state mode.

GaN HEMTs can demonstrate significantly reduced input capacitances compared to Silicon Superjunction MOSFETs. Additionally, GaN HEMTs can also demonstrate reductions in output capacitance and output capacitance stored energy compared to a Silicon Superjunction MOSFET. These qualities, depending on the application, may be leveraged to increase the frequency of operation of a system achieving an increase in power density while maintaining or increasing the efficiency of a system.

Zero voltage switching (ZVS) in power electronics applications can have several advantages such as reduced switching losses and reduced emission of electromagnetic interference (EMI) signals.

Although GaN HEMTs can exhibit superior performance versus Si devices in both hard-switching and soft-switching systems, zero voltage switching (ZVS) turn-on is popular in applications where efficiency is the primary design target, due to the relatively higher switching-on loss compared with switching-off loss.

Therefore, the combination of the competitive device parameters of GaN HEMTs and the reduction in switching losses associated with zero voltage switching topologies is a very interesting proposition for high efficiency and high power density applications.

The ability to sense the voltage on the drain terminal of the GaN HEMT can be of use in zero voltage switching applications. Sensing the drain to source voltage of a GaN HEMT and using the sense signal such that the potential on the gate terminal of the GaN HEMT is only permitted to rise to the on-state bias range (Vgs=4V and 7V as described above) when the drain to source voltage is low (e.g. zero or 2% of device breakdown rating), allows the designer to simplify the control and increase the efficiency of a system using the device in a ZVS mode.

A simple example of a synchronous buck converter will be used to better illustrate some of the concepts described. Deadtime, in this example, may be defined as the period where both the high side and low side devices of the half bridge have a low Vgs signal just after the high side gate bias has been driven low and just before the low side gate bias is about to be driven high.

If no deadtime is present and a high gate bias is present in the low side and high side device simultaneously, shoot through current may be observed as both devices are on.

If deadtime is too short additional switching losses may be present due to hard switching. Hard switching is often defined as a significant overlap between drain-source voltage and current across the device during switching.

Alternatively, increased conduction losses may be observed in the low side device if the deadtime is too long. During deadtime the GaN HEMT may be in reverse conduction mode with Vgs=0V.

A GaN IC that can operate as described herein, may be able to reduce conduction losses during reverse conduction mode operation by minimizing the period of time where the low side device is reverse conducting with a gate bias, Vgs=0V. Reverse conduction under this condition (Vgs=0V), which occurs during the dead time, is particularly lossy in GaN devices as outlined herein.

Reverse conduction refers to the mode of operation where the drain terminal of the device is at a lower potential than the source terminal. In this conduction mode the current flows from the source to the drain terminal. Power MOSFETs contain an intrinsic p-n diode which can be optimized to reduce conduction losses in the reverse conduction mode of operation. Low conduction losses can be achieved without actively driving the gate terminal of the MOSFET device (i.e. with Vgs at 0V). Such an in-built diode is not present in the heterostructure based AlGaN/GaN HEMTs.

GaN HEMTs in prior art do not contain such an in-built diode but do have some reverse conduction capability, a typical reverse conduction I-V characteristic can be seen in FIG. 1. At Vgs=0V a significant voltage drop is present before current can flow in the reverse direction in the device. This can lead to significant conduction losses in this mode of operation lowering the overall efficiency in an application. Optimizing the design of a p-GaN HEMT in order to minimize this voltage drop results in a trade-off with the aim of achieving a high threshold voltage (Vth) for the device. A low threshold voltage can create other problems in operation for a GaN HEMT device, for example device re-triggering under certain conditions.

Minimizing deadtime leads to a reduction in the amount of time where the device is reverse conducting with gate bias, Vgs=0V. This may therefore lead to a significant decrease in the conduction losses observed in the example described.

Another exemplary application where it is desirable for the necessary dead time between high side and low side gate drive signal to be minimized is that of an LLC half bridge DC/DC converter.

Another exemplary application where it is of interest to detect the drain source voltage across a device may be an active clamp flyback, where a low drain-source voltage across the low side device must be detected before a positive gate bias (e.g. Vgs=4-7V) is applied to the low side device to turn it on.

Depending on the application topology, an enhancement mode power device may (in addition to forward conduction and off-state mode operation) operate in reverse conduction mode as described above for a significant proportion of the overall operation time.

As illustrated in FIG. 1, a significantly reduced voltage drop is observed in reverse conduction mode when the gate terminal is actively driven (e.g. Vgs=6V). Sensing when the power device operates in reverse conduction and actively driving the gate terminal can therefore lead to a significant reduction in conduction losses. Reverse conduction mode of operation can be identified by sensing the voltage on the drain terminal of the GaN HEMT and therefore the direction of current flow in the device.

In a similar manner a smart rectifier IC could be designed. The smart rectifier could still comprise a three terminal GaN HEMT but may not require an external gate drive signal to operate. The signal defining when the gate should be actively driven bringing the device into active reverse conduction stage (similar to the forward conduction stage of a conventional p-n or Schottky diode) would be derived by sensing the drain to source voltage or a proportion of the drain to source voltage across the GaN HEMT. This approach may be beneficial compared to GaN heterojunction Schottky diodes found in prior art. GaN heterojunction Schottky diodes may show a trade-off between low on-state voltage drop and low off-state leakage at the Schottky junction. A recessed Schottky diode may have a low on-state voltage drop but may suffer from high off-state leakage. Alternatively, a non-recessed Schottky diode may have comparatively low off-state leakage but may suffer from a high on-state voltage drop. A smart rectifier IC may not be restricted by this trade-off.

SUMMARY

In this invention a GaN Power integrated circuit is disclosed which can sense the drain voltage of the GaN HEMT under different conditions and can adjust the drive of the gate terminal of the GaN HEMT in order to limit conduction losses and/or switching losses.

According to one aspect of this invention, there is provided a III-nitride power semiconductor based heterojunction device (also termed in this disclosure as the GaN chip or GaN Power integrated circuit) comprising a first terminal, a second terminal and a control terminal and further comprising a substrate and an active heterojunction transistor (also termed the high voltage HEMT or the main HEMT) formed on a substrate, the active heterojunction transistor comprising:

a first III-nitride semiconductor region comprising a first heterojunction comprising an active two-dimensional carrier gas;

a source terminal operatively connected to the III-nitride semiconductor region and further connected to the first terminal;

a drain terminal laterally spaced from the first terminal and operatively connected to the III-nitride semiconductor region and further connected to the second terminal;

an active gate region formed over the III-nitride semiconductor region and between the first terminal and the second terminal; and an internal gate terminal operatively connected to the active gate region;

the III-nitride power semiconductor based heterojunction device further comprising:

a. a gate drive circuit (and/or a gate drive interface circuit) connected to the control terminal and further connected to the internal gate terminal of the active heterojunction transistor, the gate drive circuit configured to provide a driving signal to the internal gate terminal of the active heterojunction transistor;

b. a sensing circuit connected to the drain terminal of the active heterojunction transistor, and further connected to the first terminal, the sensing circuit being configured to sense a current and/or voltage at the drain terminal of the active heterojunction transistor and to generate an output signal; and c. an active stage circuit connected to the sensing circuit, and further connected to the gate drive circuit and to the source terminal of the active heterojunction transistor, the active stage circuit being configured to receive the output signal from the sensing circuit, and further configured to cause the gate drive circuit to adjust the driving signal based on the output signal from the sensing circuit;

d. wherein, in use, when the active heterojunction transistor is in a forward conducting state, the first terminal is a low voltage terminal and the second terminal is a high voltage terminal; and e. wherein, when the active heterojunction transistor is in a reverse conducting state, the first terminal is a high voltage terminal and the second terminal is a low voltage terminal.

The active heterojunction transistor may be a high voltage HEMT and/or may be referred to as a main HEMT.

The main HEMT has two main terminals, the source terminal and the drain terminal and one control terminal, the gate terminal (described as the internal gate terminal in the first aspect of the invention). In an example where the two-dimensional carrier gas is a two-dimensional electron gas (2DEG), the internal gate terminal modulates the strength of the 2DEG below the active gate region. In the forward conduction state, the drain terminal sits at higher potential than the source terminal. Provided that the internal gate terminal potential is higher than the source terminal voltage by at one threshold voltage, in this state electrons (which have negative charge) flow via the 2DEG from the source to the drain and consequently the current flows from the drain terminal to the source terminal. In the reverse conduction state, the source terminal sits at a higher potential than the drain terminal and the current flows through the 2DEG in the opposite direction from source to drain. In the III-nitride power semiconductor based heterojunction device disclosed in the first aspect of this invention, and described above, the source terminal of the main HEMT is connected to the first terminal, while the drain terminal of the main HEMT is connected to the second terminal. It is therefore inferred that during the forward conduction, the second terminal is a high voltage terminal and the first terminal is a low voltage terminal. In this state the current flows from the second terminal to the first terminal. In the reverse conduction, the first terminal is a high voltage terminal and the second terminal is the low voltage terminal and in this state the current flows from the first terminal to the second terminal.

It will be understood that the output signal from the sensing circuit may be referred to as an input signal to the active stage circuit.

In some examples, one or more of the active heterojunction transistor, the gate drive circuit, the sensing circuit, and the active stage circuit may be monolithically integrated.

In some examples, the gate drive circuit may not be monolithically integrated but rather co-packaged with the III-nitride power semiconductor based heterojunction device, included in a GaN module arrangement, and/or included at system level.

The gate drive circuit may be further configured to actively drive the internal gate terminal of the active heterojunction transistor when the sensing circuit senses a voltage at the drain terminal of the active heterojunction transistor relative to the source terminal of the active heterojunction transistor that is below a zero signal voltage. Such a configuration may advantageously enable zero (or largely zero) voltage switching of the III nitride power semiconductor based heterojunction device.

In some examples, the active heterojunction transistor may have an associated device breakdown rating voltage, and the zero signal voltage may have a maximum value of about 2% of the device breakdown rating voltage. In some examples, the zero signal voltage may have a maximum value of about 5 V. In some examples, the zero signal voltage may have a maximum value of about 10 V.

Optionally, the GaN Chip described in the invention may be configured to sense a zero voltage (or low voltage e.g. 2% of device breakdown rating) on the drain terminal of the main HEMT before initiating actively driving the gate terminal of the main HEMT enabling zero voltage switching and a reduction in switching losses. This may be defined as active zero voltage switching (ZVS) functionality.

In some examples, the GaN Chip described in the present disclosure may be configured to sense a reverse current flowing through the main HEMT and initiate actively driving the gate terminal of the main HEMT in order to reduce conduction losses. This may be defined as active reverse conduction functionality.

In some examples, the control terminal of the GaN power circuit is optional and the at least one connection of the gate drive circuit (and/or gate drive interface circuit) to the control terminal is not present. In this embodiment the GaN power circuit may operate as a smart rectifier.

In some examples, the rise in the gate terminal of the main HEMT during the reverse conduction period of operation, could match the gate bias applied by the gate driver during the on-state period of operation of the device (e.g. Vgs=6V). This embodiment would be the best option in terms of achieving the greatest reduction in conduction losses during reverse conduction.

In some examples, the rise in the gate terminal of the main HEMT during the reverse conduction period of operation, could be at any level within the recommended gate bias operation range of the device (e.g. Vgs>4V). A gate bias of 4V may not be as beneficial as a gate bias of 6V in terms of the achievable reduction in conduction losses, however if the gate bias is still within the recommended operation range of the device this difference in the benefit of reduced losses may be small. For example, less than 10% difference may be expected between the Vgs=4V and Vgs=6V case.

In some examples, the rise in the gate terminal of the main HEMT during the reverse conduction period of operation, could be at any level which can achieve a reduction in conduction losses compared to the case where the gate bias during this period of conduction is at 0V or at a negative potential. While the reduction in conduction losses achieved using this example may not be as large as previous examples, it may be easier to design a GaN chip which can offer this functionality using lower component count, reduced power consumption, reduced design complexity.

In some examples, the sensing circuit may comprise a sensing high voltage enhancement mode HEMT in series with a resistive or non-linear element wherein the drain terminal of the sensing enhancement mode HEMT is operatively connected to the high voltage terminal of the main HEMT. The output signal of the sensing circuit which is provided to the active stage circuit may be drawn from the source terminal of the sensing HEMT.

The gate terminal of the sensing HEMT may be set to a DC voltage level or can be operatively connected to the low voltage terminal of the main HEMT. In the case of a DC voltage level, this can be supplied directly by an external voltage or can be generated/regulated on chip from a different voltage supply. The gate terminal may further be actively controlled to adapt the sensing circuit to varying statuses of the power electronics system.

In some examples the sensing HEMT may be depletion mode rather than enhancement mode. The use of a depletion mode HEMT may be beneficial as a DC voltage level bias on the gate terminal of the depletion mode HEMT may not be necessary.

The resistive or non-linear element may comprise resistors, capacitors, current sources, diodes and/or source-gate connected E-HEMTs. The choice of the resistive element may be an important design decision as it can determine the off-state current through the sensing circuit and therefore power dissipation in the off-state condition.

The sensing circuit may have an active enable and disable function by connecting an actively controlled E-HEMT or D-HEMT across the resistive or non-linear element to short it out. Additional components (e.g. transistors, resistors) may be required in the sensing circuit to limit the power consumption of the circuit during the disable mode of operation, that is the period of operation where the sensing circuit is disabled. Exemplar embodiments are described in the DETAILED DESCRIPTION OF THE PREFERRED EMBODIMENTS section of the present disclosure. These embodiments may be desirable in applications where active ZVS functionality or active reverse conduction functionality are not desirable in all conditions of operation of the circuit.

The sensing circuit may comprise an output stage. The output signal may be output via the output stage of the sensing circuit.

In some examples, the sensing circuit comprises: a sensing high voltage, low power enhancement mode heterojunction transistor in series with a resistive or non-linear element; and further wherein the drain terminal of the sensing high voltage, low power enhancement mode heterojunction transistor is operatively connected to the second terminal of the III-nitride power semiconductor based heterojunction device; and wherein the resistive or non-linear element comprises one or more resistors, capacitors, current sources and/or diodes.

In some examples, the sensing circuit further comprises an output stage, wherein the output signal is output via the output stage of the sensing circuit; and wherein a further enhancement mode transistor is configured between the output stage and the first terminal; wherein a gate of the further enhancement mode transistor is operable via an enable/disable signal.

The active stage circuit may comprise input and/or output stages. The output signal may be received by the input stage of the active stage circuit. The output stage of the active stage circuit may cause the gate drive circuit to adjust the driving signal based on the output signal from the sensing circuit.

The output stage of the sensing circuit, or the input or output stages of the active stage circuit, may comprise additional functional blocks such as an amplifier, buffer, Schmitt trigger, latching circuit, voltage follower, logic gate, inverter, level shifter, filter or similar. These blocks may be described as a signal conditioning block.

In an example the active stage circuit may comprise at least one depletion mode HEMT. This example may be more suitable in embodiments which provide active reverse conduction functionality as illustrated in the exemplar circuits in the DETAILED DESCRIPTION OF THE PREFERRED EMBODIMENTS section of the present disclosure.

In an example the active stage circuit may comprise at least one enhancement mode HEMT. This example may be more suitable in embodiments which provide active zero voltage switching functionality as illustrated in the exemplar circuits in the DETAILED DESCRIPTION OF THE PREFERRED EMBODIMENTS section of the present disclosure.

In an example the active stage circuit may comprise at least one depletion mode HEMT and at least one enhancement mode HEMT in series. This example may allow more than one input signal to the active stage circuit. The input signals can come from the sensing circuit, or the gate drive circuit as illustrated in the exemplar circuits in the DETAILED DESCRIPTION OF THE PREFERRED EMBODIMENTS section of the present disclosure.

In some examples the active stage circuit may comprise several depletion mode HEMTs and/or enhancement mode HEMTs in series.

In some examples the active stage circuit may comprise several depletion mode HEMTs and/or enhancement mode HEMTs in parallel. In this example the active stage circuit may allow more than one output from the active stage circuit providing the option of a connection between the active stage circuit and the gate drive circuit at more than one node. Such examples are illustrated in the exemplar circuits in the DETAILED DESCRIPTION OF THE PREFERRED EMBODIMENTS section of the present disclosure.

In some examples the active stage circuit may comprise at least one voltage amplifier. In exemplar embodiments of this invention the amplifier may be in a common source arrangement or a common gate arrangement. In examples where the active stage circuit contains a voltage amplifier for the sensing signal the power consumption of the overall design may increase compared to the examples where the active stage does not contain a voltage amplifier. Amplification of the sensing signal in the active stage circuit may however improve the response time of the circuit.

The output and input of the active stage circuit may comprise additional functional blocks such as a buffer, Schmitt trigger, latching circuit, voltage follower, logic gate, inverter, level shifter, filter or similar. These blocks may be described as a signal conditioning block.

A buffer or a voltage follower may be useful is some examples such that the current drawn from the sensing circuit is small. This can reduce power consumption in the sensing circuit especially during off-state operation where the drain terminal of the GaN chip is at a high voltage.

A Schmitt trigger or latching circuit may be useful in some examples to avoid oscillations during the transition between different modes of operation of the GaN chip.

An inverter or other logic gates may be useful in some examples to achieve the desired functionality of the GaN chip circuit in the different modes of operation.

A filter may be useful in some examples to reduce any parasitic oscillations during fast switching of the GaN chip.

In some examples the signal from the active stage circuit is applied as a digital input to the controller, gate driver and/or gate drive interface. These embodiments may be more suitable in the case where the gate driver is not monolithically integrated with the GaN High Voltage HEMT but rather is implemented in a silicon chip.

In some examples the signal from the active stage circuit is applied as an analog input to the gate driver and/or gate drive interface. These examples may be more suitable in the case where the gate driver is monolithically integrated with the GaN High Voltage HEMT.

In some examples the output signal from the active stage circuit may be a voltage signal.

In some examples the output signal from the active stage circuit may be a current signal.

In some examples the output signal from the active stage circuit may be defined as the presence or absence of a low resistance path to ground from the node where the output of the active stage circuit is connected. These examples may lead to higher power consumption if the node where a low resistance path to ground is provided can draw significant current.

In some examples the active stage circuit may comprise a differential amplifier. In some examples the differential amplifier may comprise only enhancement mode transistors and resistive elements. In other examples the differential amplifier may comprise enhancement mode transistors, depletion mode transistors and resistive elements. The use of only these components to design a differential amplifier allows the monolithic integration of a differential amplifier using currently mature GaN technology.

In some examples the active stage circuit may comprise a comparator. In some examples the comparator may comprise only enhancement mode transistors and resistive elements. In other examples the comparator may comprise enhancement mode transistors, depletion mode transistors and resistive elements. The use of only these components to design a comparator allows the monolithic integration of a differential amplifier using currently mature GaN technology.

Monolithically integrated designs in GaN can provide reduced complexity, reduced sense and act response time and reduced parasitics.

Any of the active stage circuits described herein may be adjusted to obtain an input-offset voltage. The input off-set voltage may be adjustable by circuit design. In some examples the active stage circuit may comprise an additional input where external passive components such as a resistors or capacitors may be connected, and where the value of the component connected to the additional input allows a change in the input off-set voltage of the active stage circuit. In some examples the adjustment may be achieved by integrating a range of said resistive elements or capacitors on the chip and changing the metal interconnects to connect to a selection of said resistive elements or capacitors based on the desirable value for a specific design.

In some examples the input-offset voltage may be adjusted based on the comparator design to avoid false triggering of the active stage circuit when noise or undesirable oscillations are detected at the input of the active stage circuit. The input off-set voltage may be negative.

In some examples the output of the active stage circuit may be a voltage signal between 0V and a fixed voltage. The fixed voltage may be applied as an external input to the active stage or may be generated on the GaN IC.

In some examples, the active stage circuit output acts as an input to a controller in addition or instead of providing a signal to the gate drive circuit and/or gate drive interface circuit.

In some examples the active stage circuit may additionally comprise a voltage rail which may be externally applied or derived from another voltage source on the IC.

In some examples the gate drive circuit may comprise a MOSFET Totem pole driver. The driver may be inverting or non-inverting.

In some examples the gate drive circuit may comprise a Bipolar Totem pole driver.

The Totem pole drives may preferably be designed in silicon rather than GaN due to the lack of technological maturity of p-channel devices in GaN technology.

In some examples the gate drive circuit may comprise the driver and its variations as described in US patent publication no. US 2021/0335781 A1, which is hereby incorporated by reference in its entirety.

This example may preferably be implemented monolithically in GaN.

In some examples the integrated circuit may also comprise a gate drive interface circuit between the gate drive circuit and the high voltage transistor. This gate drive interface circuit may comprise the circuit and its variations described in US patent publication no. US 2021/0335781 A1 and International Patent publication no. WO 2020/225362 A1, both of which are hereby incorporated by reference in their entirety.

This example allows the implementation of the added functionality (active zero voltage switching or active reverse conduction) without any changes to the gate drive circuit.

In some examples the integrated circuit may comprise a gate drive interface circuit placed between the source of the control signal (e.g. microcontroller) and the gate drive circuit. This gate drive interface circuit may comprise some combinational logic circuits.

In some examples at least one of the circuit blocks described in this invention is not monolithically integrated with the other circuit blocks. Any combination of the circuit blocks described may instead be integrated at package level or at printed circuit board level resulting in a GaN module.

For example, in some embodiments, the zero-voltage sensing circuit could be provided as a packaged component.

In some examples, a combination of the zero-voltage sensing circuit and the active stage circuit could be provided as a packaged component.

Monolithically integrated designs in GaN can provide reduced complexity, reduced sense and act response time and reduced parasitics. As described above some of the circuit blocks may be preferentially implemented in silicon rather than GaN due to the current state of GaN technology. Designs in GaN may become more competitive in terms of performance as technology of the components which make up the integrated circuit matures. In some examples, the capability to overrule the active zero voltage switching functionality is included as in some scenarios, a mixture of ZVS and hard switching is needed. Zero voltage switching functionality refers to the mode of operation described herein where a device is not allowed to transition from off-state to on-state mode of operation (through the application of a suitable Vgs bias) unless the voltage across its drain and source terminal drops below a certain value, for example <2% of the nominal voltage rating of the device.

In some examples the signal to enable or disable the ZVS function may be an additional external signal.

In some examples the signal to enable or disable the ZVS function may be generated on the GaN IC, co-packaged component or the GaN module. This example may increase design complexity but may provide ease-of-use to the user of the GaN chip.

In some examples, the ZVS overrule circuit block is included in the sensing circuit.

In some examples, the ZVS overrule circuit block is included in the active stage circuit.

In some examples, the ZVS overrule circuit block is included in the gate driver and/or gate drive interface circuit.

In some examples the overrule function is implemented using additional transistors. These transistors may be arranged to short a critical node to ground.

In some examples the overrule function is implemented using additional logic gates.

Exemplar circuits of these embodiments are illustrated in the DETAILED DESCRIPTION OF THE PREFERRED EMBODIMENTS section of the present disclosure.

DETAILED DESCRIPTION OF THE PREFERRED EMBODIMENTS

Figure 1:
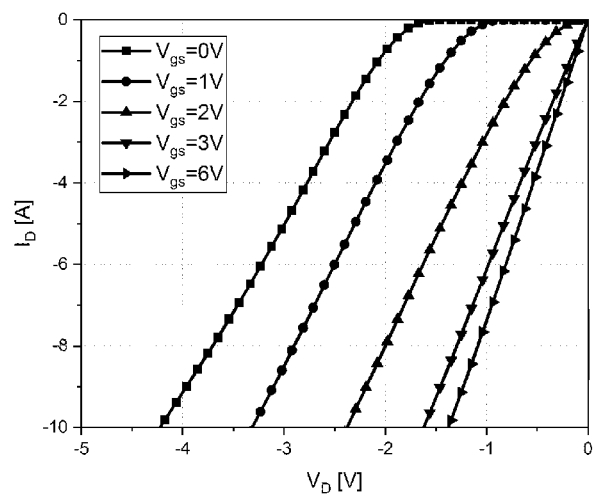
FIG. 1 is a graph illustrating a typical reverse conduction I-V characteristic of a GaN HEMT.
Figure 2:
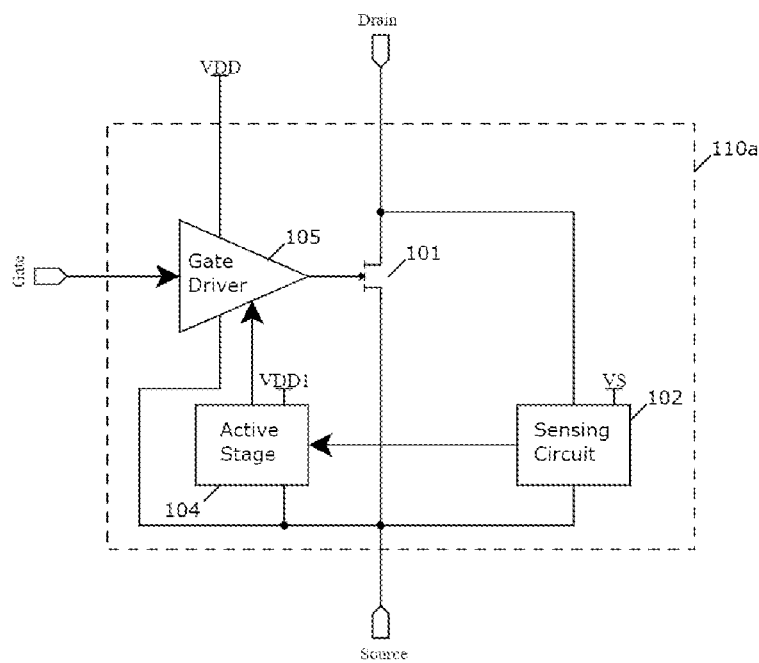
FIG. 2 is a schematic illustration of a power semiconductor device according to the present disclosure.

FIG. 2 shows a circuit schematic representation of one embodiment of the proposed disclosure. This embodiment illustrates a power semiconductor heterojunction device 110a (which may be a GaN chip or GaN power integrated circuit, and is hereafter referred to as a GaN chip) comprising an active heterojunction transistor 101, (referred to herein as a high voltage heterojunction transistor, such as a high voltage HEMT, or high voltage transistor), a sensing circuit 102, an active stage circuit 104 and a gate drive circuit 105.

In general, the active heterojunction transistor comprises: a first III-nitride semiconductor region comprising a first heterojunction comprising an active two dimensional carrier gas; a source terminal operatively connected to the III-nitride semiconductor region and further connected to the first terminal; a drain terminal laterally spaced from the first terminal and operatively connected to the III-nitride semiconductor region and further connected to the second terminal; an active gate region formed over the III-nitride semiconductor region and between the first terminal and the second terminal; and an internal gate terminal operatively connected to an the active gate region.

The GaN chip illustrated comprises at least four terminals: a high voltage terminal, a low voltage terminal, a control terminal and a voltage supply terminal (VDD).

In some examples, further DC voltage rails may be present in the chip, labelled in the example of FIG. 2 as VS and VDD1. These may either be applied externally or may be generated on the GaN chip from VDD.

The GaN chip in this embodiment can sense the voltage on the drain terminal of transistor 101 through the sensing circuit 102 and provide a signal to the active stage circuit 104 which can adjust the driving pattern of transistor 101.

Figure 3:
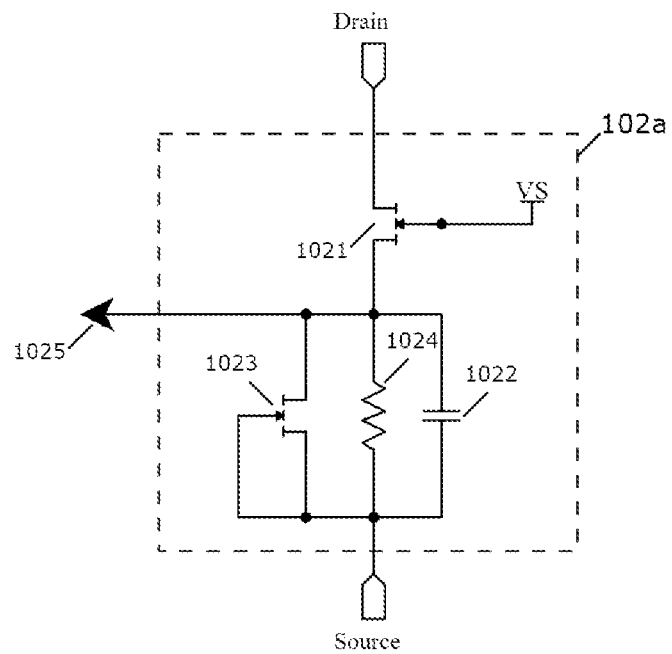
FIGS. 3 to 6 are schematic illustrations of example sensing circuits according to the present disclosure.

In one example sensing circuit 102a, such as the one illustrated in FIG. 3, the output of the sensing circuit may be configured to have the following characteristics:

When the main HEMT pGaN gate is driven on (e.g. Vgs=6V) and the potential on the drain terminal of transistor 101 is low positive (e.g. 10V>Vds>0)→sensing circuit output is 0V or positive.

When the main HEMT pGaN gate is driven off (e.g. Vgs=0V) and the potential on the drain terminal of transistor 101 is high positive (e.g. Vds>10V)→sensing circuit output is VS— Vth (where Vth is the threshold voltage of the sensing transistor 1021).

When the main HEMT pGaN gate is driven off (e.g. Vgs=0V) and the potential on the drain terminal of transistor 101 is negative (i.e. Vds<0)→sensing circuit output <0.

The sensing circuit 102a in FIG. 3 comprises a sensing enhancement mode high voltage transistor 1021, a capacitor 1022, a resistor 1024 and a source-gate connected transistor 1023.

In one example mode of operation, the GaN Chip 110a can sense when the power device operates in reverse conduction and actively drive the gate terminal which can lead to a significant reduction in conduction losses.

In this mode of operation, the active stage circuit will receive a negative input signal from the sensing circuit when the main HEMT is in reverse conduction mode. The active stage should therefore be designed to enable or allow an increase in the main HEMT gate voltage potential when it receives the aforementioned negative input signal from the sensing circuit.

Figure 4:
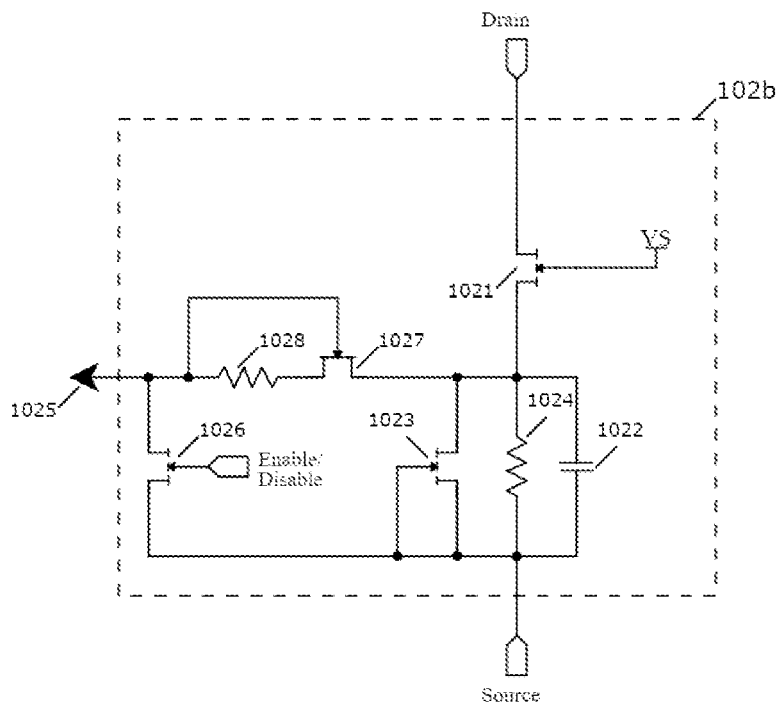

The required function is as follows:

Sensing output signal positive or 0→gate of transistor 101 should correspond to gate control signal Sensing output signal negative→gate of transistor 101 should rise (Vgs>0V) irrespective of gate control signal In another example as illustrated in FIG. 4 an example sensing circuit 102b comprises an Enable and Disable function by connecting an actively controlled E-HEMT 1026 as illustrated. An Enable/Disable pin may receive a signal generated on the IC or may be an external terminal. E-HEMT 1026 may be replaced by a D-HEMT. A current source, comprised by depletion mode HEMT 1027 and resistor 1028, is placed between the source of the high voltage transistor 1021 and the actively controlled E-HEMT 1026. The current source may limit the power consumption through the sensing circuit during the Disable mode of operation.

Figure 5:
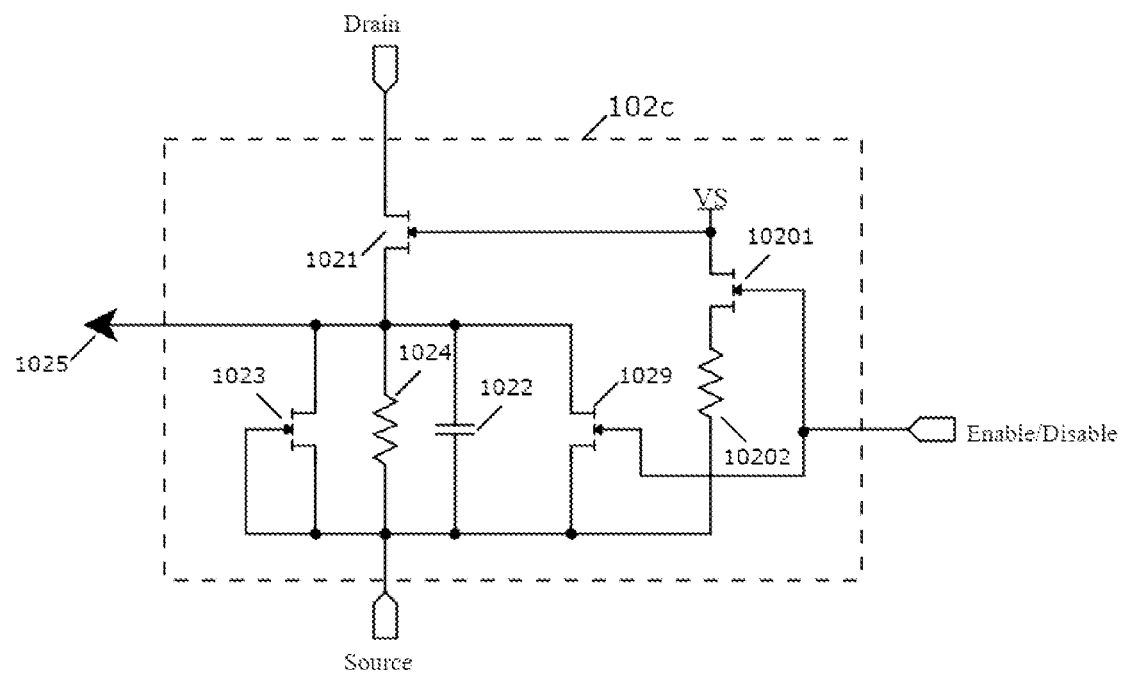

In another example sensing circuit 102c illustrated in FIG. 5 the Enable/Disable function is implemented using actively controlled E-HEMTs 1029 and 10201. E-HEMT 1029 can short the output signal 1025 to ground during Disable mode. E-HEMT 10201 can turn-off high voltage transistor 1021 during Disable mode. Resistor 10202 can limit the power consumption from VS by limiting the current to ground during Disable mode.

Figure 6:
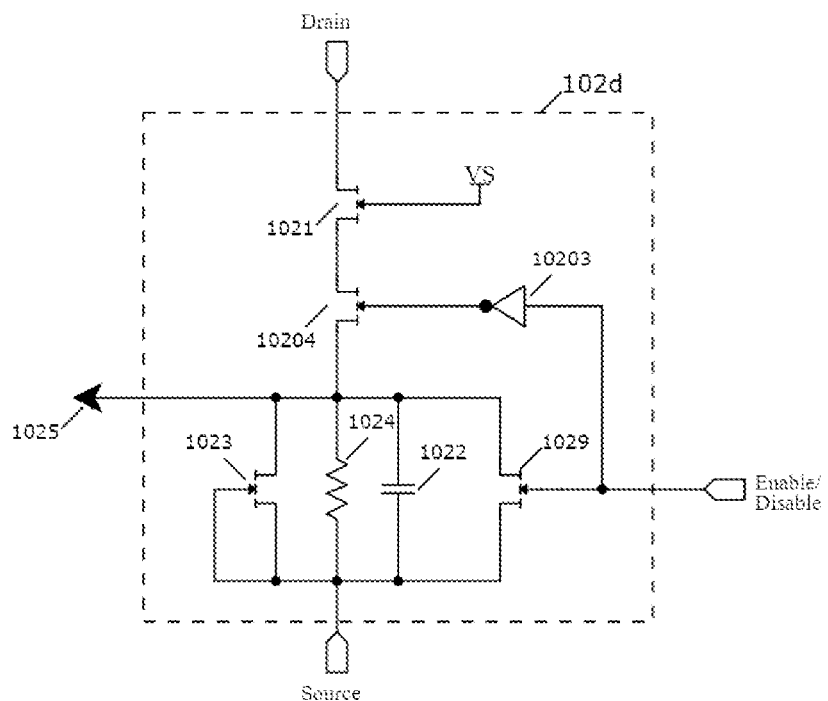

In another example sensing circuit 102d illustrated in FIG. 6 the Enable/Disable function is implemented using actively controlled E-HEMTs 1029, 10204 and inverter 10203. E-HEMT 1029 can short the output signal 1025 to ground during Disable mode. E-HEMT 10204 which is a high voltage transistor can limit the power consumption of the sensing circuit during Disable mode as it would in the off-state during this mode of operation.

Depending on the gate drive circuit used in the GaN chip, an appositely designed active stage circuit can be used.

In some embodiments, the output signal from the active stage circuit may be a voltage signal. In some embodiments, the output signal from the active stage circuit may be a current signal. In some embodiments the output signal from the active stage circuit may be defined as the offering or lack of offering of a low resistance path to source to the node where the output of the active stage circuit is connected. In some embodiments, the offering or lack of offering of a low resistance path may be understood as a current signal.

If the high voltage device 101 is reverse conducting the active stage outputs a high signal (close to VDD1) and therefore one of the inputs to the NOR gate 10501 is high. This results in the output of the gate drive signal 1059 being high (close to VDD). This gate drive signal allows the gate terminal of device 101 to rise, reducing the resistance of device 101 and therefore leading to a reduction in the conduction losses during reverse conducting operation.

The output of the active stage circuit is low (close to ground) in other modes of operation other than reverse conduction.

The second input of the NOR gate 10501 is the control signal from the controller. When the active stage signal 1048 is low the output of the gate driver signal 1059 is dependent only on the control signal.

The different conditions of operation are captured in Table 1.

TABLE 1

| Gate Driver input signal from Controller | Active Heterojunction Transistor $V_{DS}$ | Sensing Circuit signal to Active Circuit | Active Stage signal to Gate Driver | Active Heterojunction Transistor $V_{gs}$ |
|---|---|---|---|---|
| Low | High positive | High | Low | Low |
| Low | Negative | Negative (<Vth) | High | High |
| High | Low positive | Low | Low | High |

Note that in the examples presented here the gate drive circuit 105 may not be monolithically integrated (see FIG. 7) but rather co-packaged or included in a GaN module arrangement or included at system level.

Figure 8:
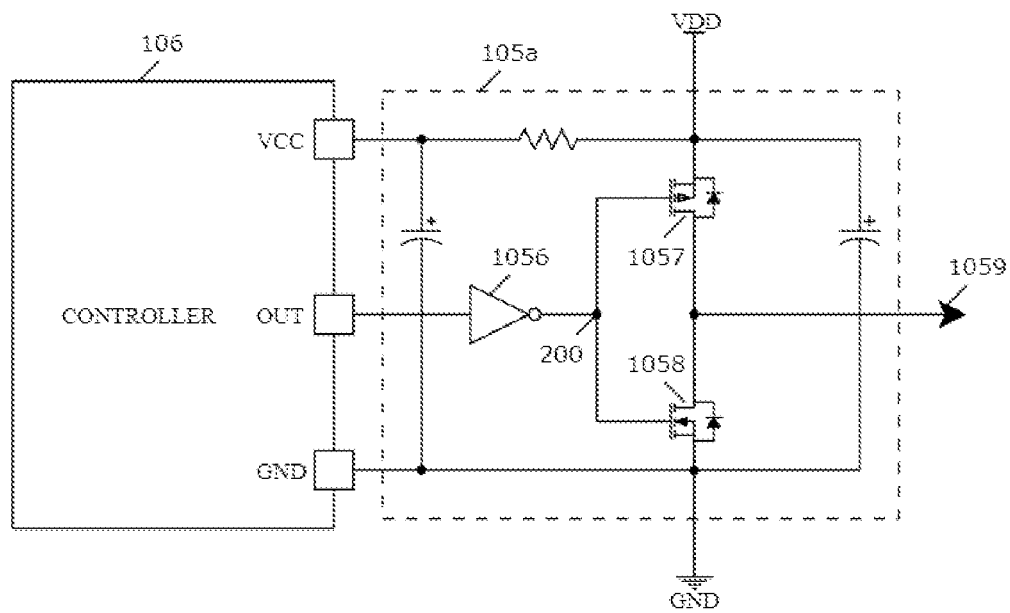
FIG. 8 is a schematic illustration of an example of a MOSFET Totem-pole driver.

In some examples, the gate drive circuit 105 may comprise a MOSFET Totem-pole driver. An example of MOSFET Totem-pole driver 105a common in prior art is shown in FIG. 8. The example gate drive circuit 105a given in FIG. 8 comprises an inverter 1056, an enhancement mode NMOS device 1058 and an enhancement mode PMOS device 1057. The gate node 200 of the two MOSFET devices is an inverted signal compared to the signal 1059 that is applied to the gate terminal of the high voltage device 101.

Figure 9:
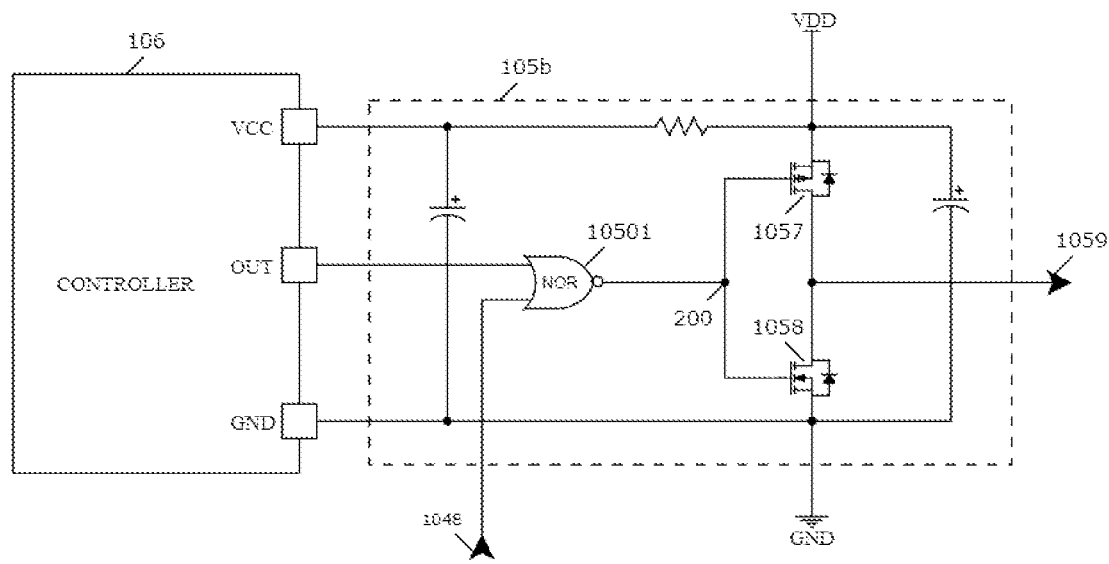
FIG. 9 is a schematic illustration of a gate drive circuit according to the present disclosure.
Figure 10:
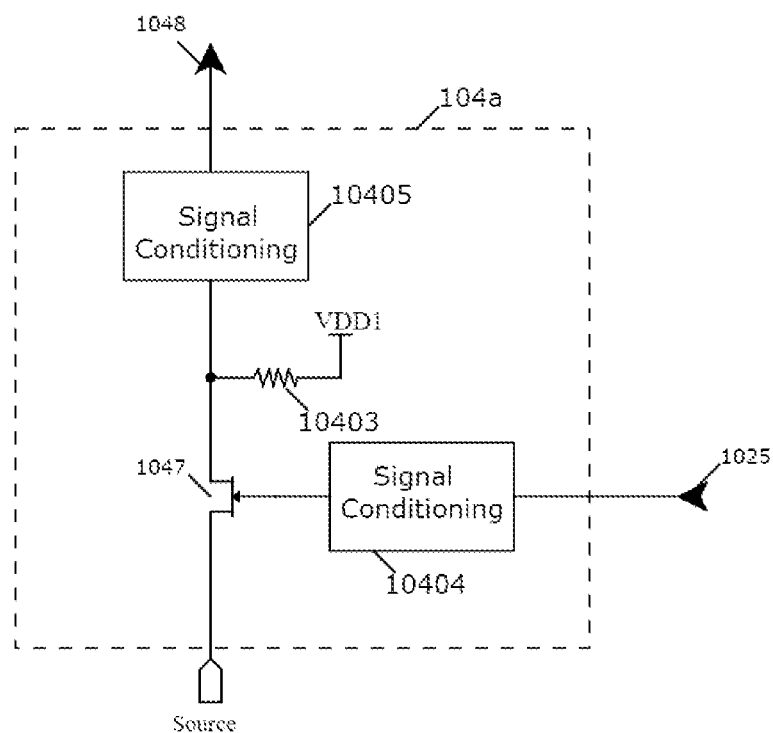
FIG. 10 is a schematic illustration of an active stage circuit according to the present disclosure.

One example of a gate drive circuit/active stage circuit combination according to this invention is given in FIG. 9 and FIG. 10.

The gate drive circuit 105 given in FIG. 9 is a MOSFET Totem-pole driver design which comprises a NOR gate 10501, an enhancement mode NMOS device 1058 and an enhancement mode PMOS device 1057.

The active stage circuit illustrated in FIG. 10 comprises a depletion mode n-channel transistor 1047, a resistor 10403, two signal conditioning circuit blocks 10404 and a voltage rail VDD1. Voltage VDD1 may be generated on the GaN IC or may be applied externally. The active stage circuit generates a voltage signal 1048.

The resistor 10403 may be replaced by a current source or an active pull-up circuit.

In some embodiments the signal conditioning circuits may be optional. In some embodiments, the signal conditioning circuit may contain functional blocks such as a buffer, Schmitt trigger, latching circuit, voltage follower, logic gate, inverter, level shifter or similar.

Signal 1025 is provided by the sensing circuit illustrated in FIG. 3.

Transistor 1047 is in the on-state when signal 1025 is zero or positive. It turns-off as signal 1025 becomes more negative than the depletion mode transistor 1047 threshold voltage.

It may be necessary for correct operation of the example presented that an element of hysteresis or latching is included on either signal 1025 or 1048. This may be implanted using a Schmitt trigger, latching circuit or other similar circuits in the signal conditioning blocks 10404, 10405. This is to avoid oscillations of the gate voltage during reverse conduction.

Figure 11:
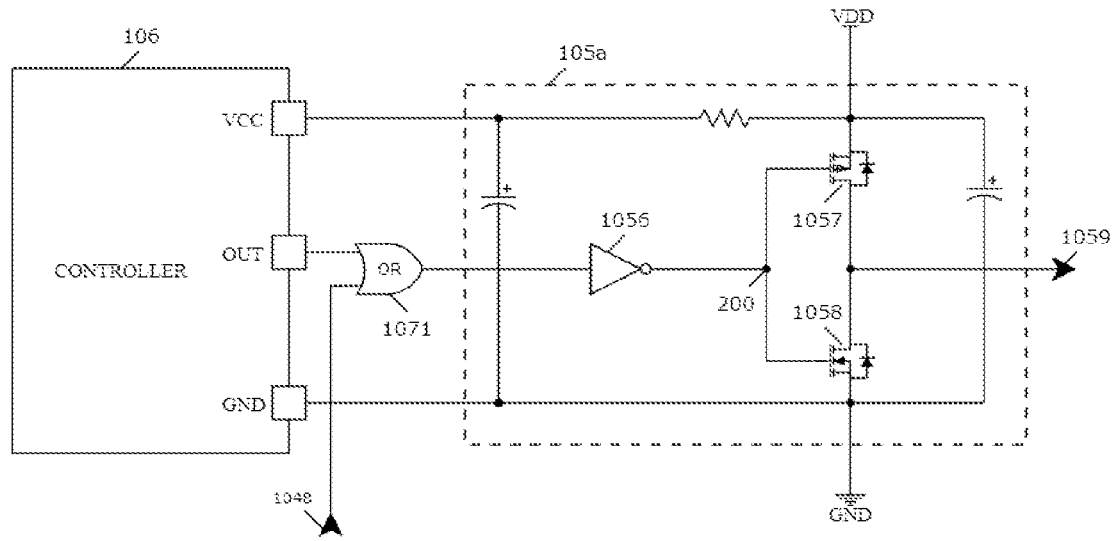
FIGS. 11 to 13 are schematic illustrations of further gate drive circuits according to the present disclosure.

In another embodiment the circuit in FIG. 11 can be combined with the active stage circuit in FIG. 10. The operation of this combination can also be summarized by Table 1. In this embodiment the gate driver 105 is identical to the gate driver presented in FIG. 8. In this embodiment an OR gate 1071 is placed between the gate driver and the controller and the active stage circuit output is an input in this OR gate. Other combinational logic circuits can be used in other embodiments.

Figure 12:
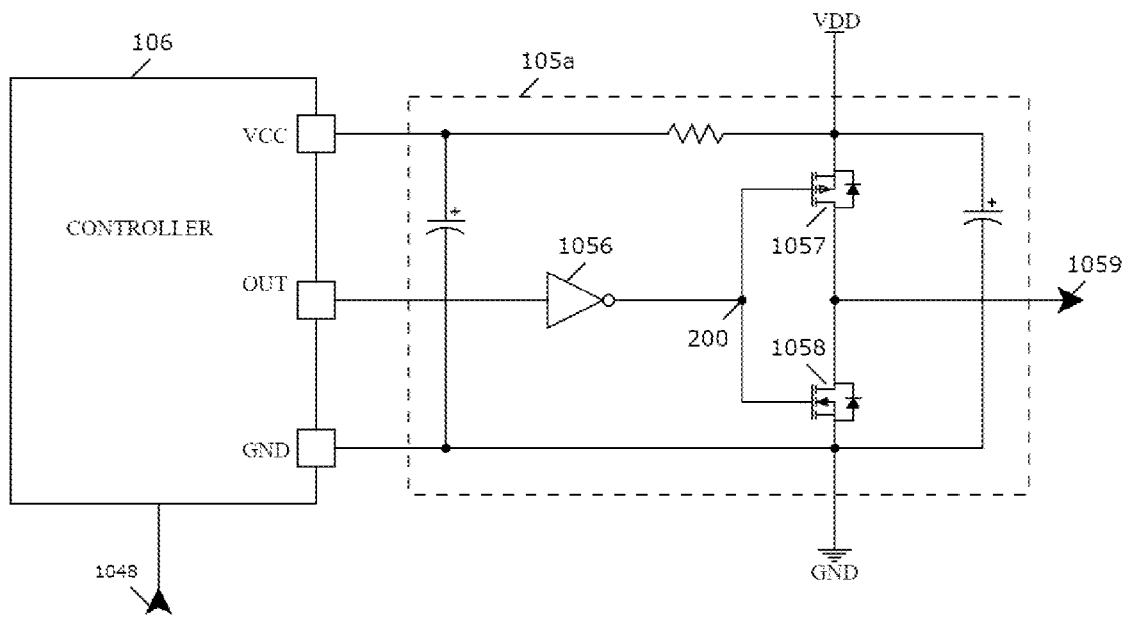

In another embodiment, illustrated in FIG. 12, the active stage circuit output 1048 is applied to the controller 106.

Figure 13:
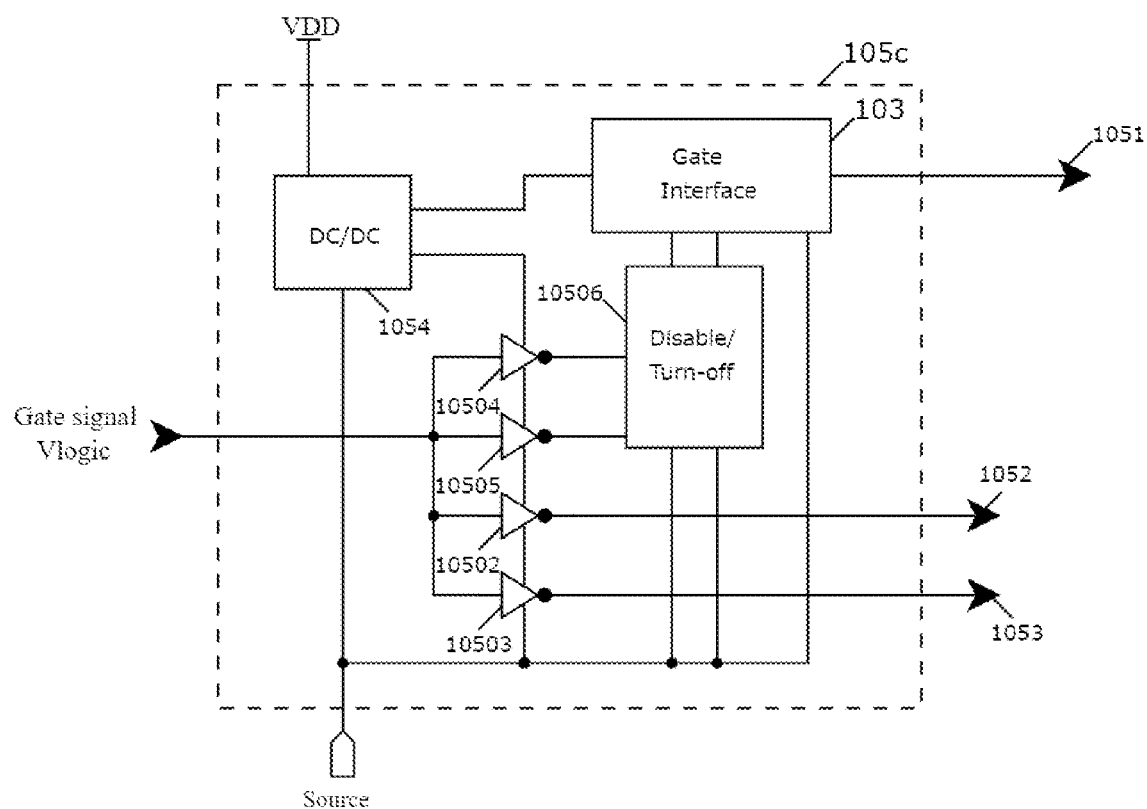
Figure 14:
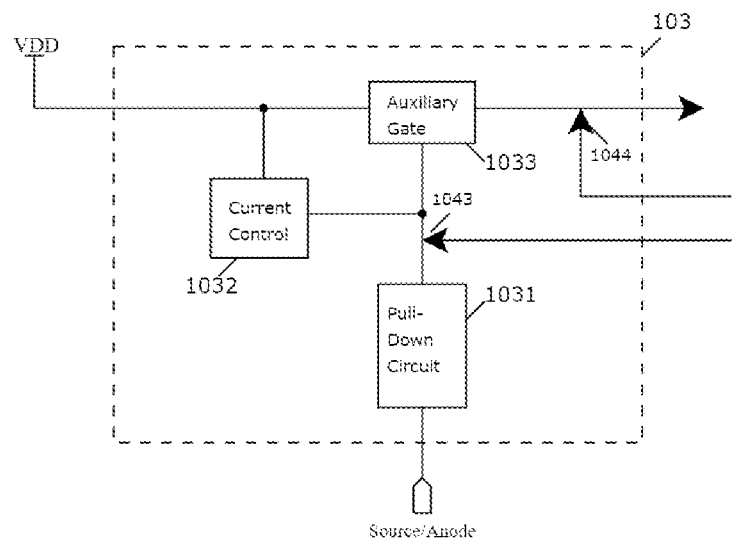
FIG. 14 is a schematic illustration of a gate drive interface circuit according to the present disclosure.
Figure 15:
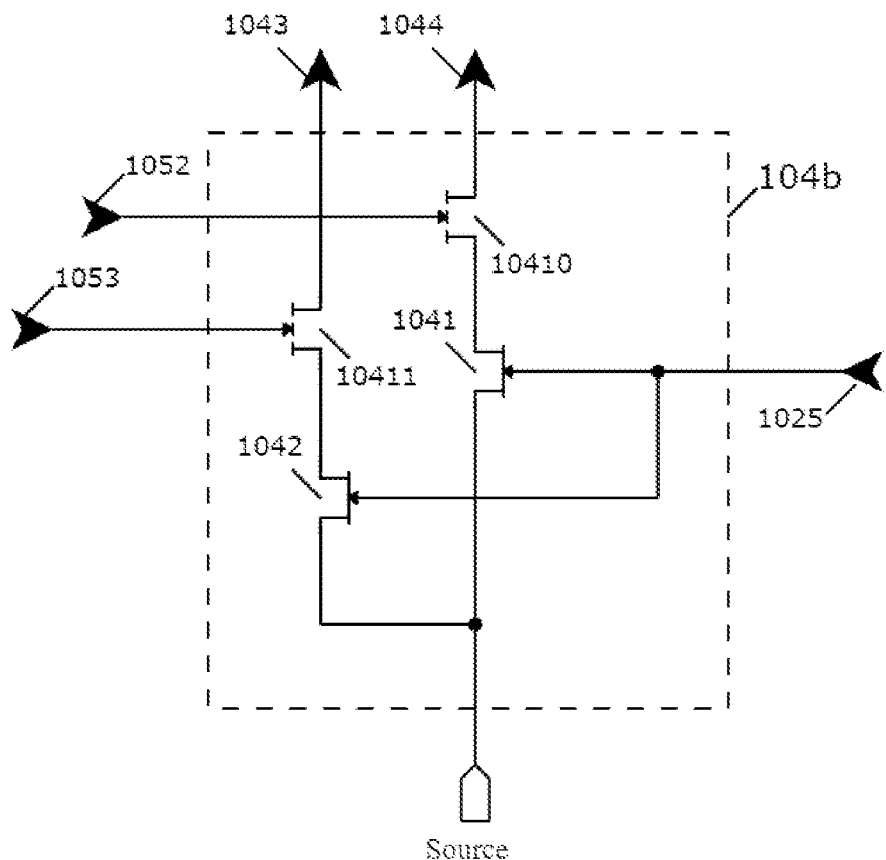
FIG. 15 is a schematic illustration of an active stage circuit according to the present disclosure.

Another example of a gate drive circuit/active stage circuit combination is given in FIG. 13, FIG. 14, FIG. 15.

The gate drive circuit 105 in FIG. 13 comprises a gate drive interface circuit 103, inverters 10502, 10503, 10504, 10505 and a DC/DC regulator 1054. The gate drive circuit 105 further comprises a disable/turn-off block 10506.

The function of the turn-off block 10506 is to provide a turn-off path for the main gate of transistor 101. In one embodiment the turn-off path comprises an enhancement mode transistor acting as a Miller clamp, that is connected between the gate and source of transistor 101. The control signal for this Miller clamp transistor could be provided by one of the inverted signal inputs of the turn-off circuit block.

The function of a disable circuit block 10506 is to enable or disable the functionality of the active reverse conduction circuit.

Signal 1051 is connected to the main gate terminal of the high voltage GaN HEMT 101. Signals 1052 and 1053 act as inputs to the active stage circuit in FIG. 15.

The gate drive interface circuit 103 comprises an auxiliary gate circuit 1033, current control circuit 1032 and pull-down circuit 1031 as illustrated in FIG. 14. The gate drive interface circuit has two input signals from the active stage circuit or disable/turn-off circuit 10506, signal 1044 and signal 1043.

The gate drive circuit given here as an example is outlined in detail in patent application US patent publication no. US 2021/0335781 A1.

The active stage circuit in FIG. 15 comprises two branches of a depletion mode HEMT and an enhancement mode HEMT in series.

Input signal 1025 is the output signal from the sensing circuit and is applied to the gate terminals of depletion mode transistors 1041 and 1042. As outlined above the output signal of the sensing circuit is negative when the potential on the drain terminal of transistor 101 is negative (i.e. Vds<0) during reverse conduction. When the gate potential of the depletion mode HEMTs is biased negatively (<Vth) the transistors can be in the off-state. This can therefore allow the potential on the terminals where 1043 and 1044 are connected to rise. The potentials on the nodes where signals 1043 and 1044 are provided (as illustrated in FIG. 14) need to increase in order for the potential on the gate terminal of the high voltage device to increase.

In the mode of operation where the external control signal (or GaN IC gate signal) is high, the enhancement mode transistors 10410, 10411 in the active stage circuit, which receive an inverted signal, are off. This allows the gate terminal of the main HEMT 101 to rise irrespective of whether depletion mode HEMTs 1041 and 1042 are on or off.

The output signals 1043 and 1044 by the active stage circuit are in this example defined as the absence or presence of a low resistance path to ground. Alternatively, this signal can be defined as a current signal.

Signal conditioning circuit blocks may be included in the input or output paths of the active stage circuit.

The different conditions of operation are captured in Table 2:

TABLE 2

| Gate Driver input signal from Controller | Active Heterojunction Transistor $V_{DS}$ | Sensing Circuit signal to Active Circuit | Active Stage resistance | Active Heterojunction Transistor $V_{gs}$ |
|---|---|---|---|---|
| Low | High positive | High | Low | Low |
| Low | Negative | Negative (<Vth) | High | High |
| High | Low positive | Low | Low | High |

In another embodiment, the active stage circuit may be implemented within the gate drive circuit block. In this embodiment, some of the components of the active stage circuit and the disable/turn-off circuit may be common, for example the active stage 104b may replace the turn-off/disable block 10506.

Figure 16:
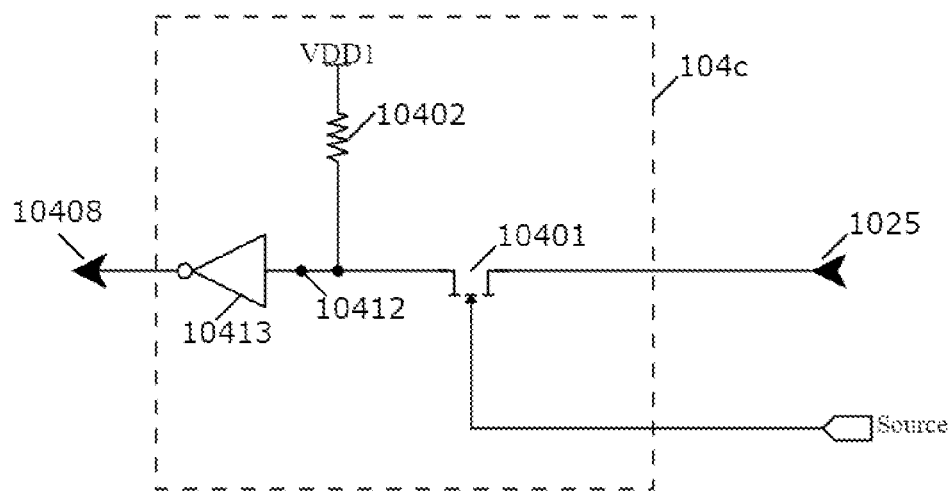
FIG. 16 is a schematic illustration of a further active stage circuit according to the present disclosure.

In an additional embodiment the active stage circuit could comprise an E-HEMT 10401 in common gate arrangement as illustrated in FIG. 16. The operation of this embodiment is as follows:

Sensing circuit signal 1025 positive or 0→E-HEMT 10401 blocking→Node 10412 is high Sensing circuit signal 1025 negative 4→E-HEMT 10401 is conducting (gate>source)→Node 10412 falls.

The active stage circuit in this example may be used in combination with gate drive circuit examples in FIG. 9, FIG. 11, FIG. 12 if the output of the common gate amplifier is inverted by inverter 10413. In another example, this active stage (node 10412) may control a second active stage. This second active stage may be similar to the one shown in FIG. 15 but comprising enhancement HEMTs instead of depletion HEMTs 1041 and 1042.

Figure 17:
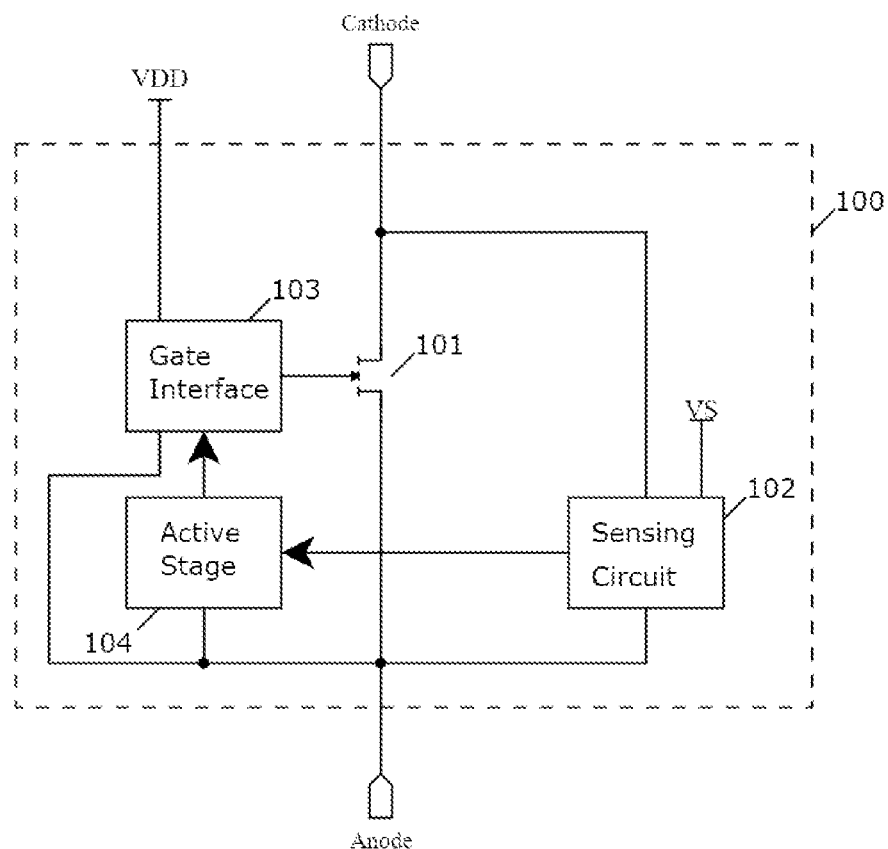
FIG. 17 is a schematic illustration of an alternative arrangement of a power semiconductor device according to the present disclosure.
Figure 18:
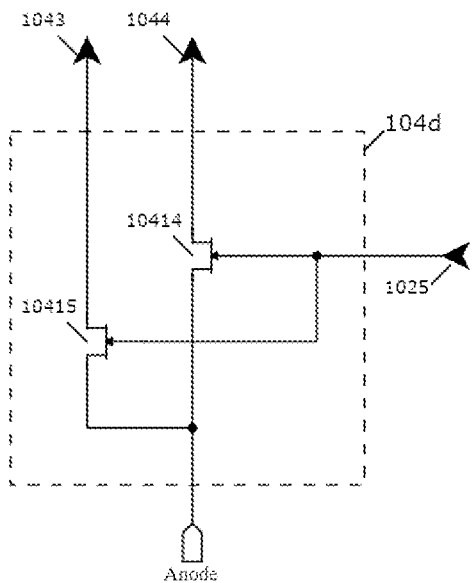
FIG. 18 is a schematic illustration of an example active stage circuit suitable for the power semiconductor device illustrated in FIG. 17.

In another embodiment the proposed invention could operate as a smart rectifier. In this embodiment there is no external control terminal and therefore no external gate signal is applied. This can be done by setting the gate signal input to a fixed voltage. A simplified alternative embodiment is shown in FIG. 17. The sensing circuit in this embodiment may be identical to the example illustrated in FIG. 3. The gate drive interface in this embodiment may be identical to the example illustrated in FIG. 14. An example of a suitable active stage circuit in this embodiment is illustrated in FIG. 18.

The different conditions of operation for this embodiment are captured in Table 3. As explained above, in this and in all the other examples the gate voltage of the high voltage device may rise as a result of the disclosed invention when the drain to source voltage is negative. Note that this gate voltage may reach the same level as when the device is turned on in forward direction or that it may reach a different level and that this voltage level may depend on the drain voltage or drain current of the active device.

However, in the following examples, the active stage circuit of the GaN chip may differ compared to the active stage circuit embodiments used in the first mode of operation. The active stage circuit in this mode of operation will receive a zero signal from the sensing circuit when the voltage across the drain-source of the main HEMT is zero. Zero signal (or low voltage e.g. 2% of device breakdown rating, or negative) across the main HEMT is important as it is at this condition where gate of the main HEMT should

TABLE 3

| Gate Driver input signal from Controller | Active Heterojunction Transistor $V_{DS}$ | Sensing Circuit signal to Active Circuit | Active Stage resistance | Active Heterojunction Transistor $V_{gs}$ |
|---|---|---|---|---|
| N/A | High positive | High | Low | Low |
| N/A | Negative | Negative | High | High |
| N/A | Low positive | Low | Low | Low |

Another embodiment of the active stage circuit comprises a comparator 10417, a resistor 10418 and two signal conditioning blocks 10404, 10405.

Figure 19:
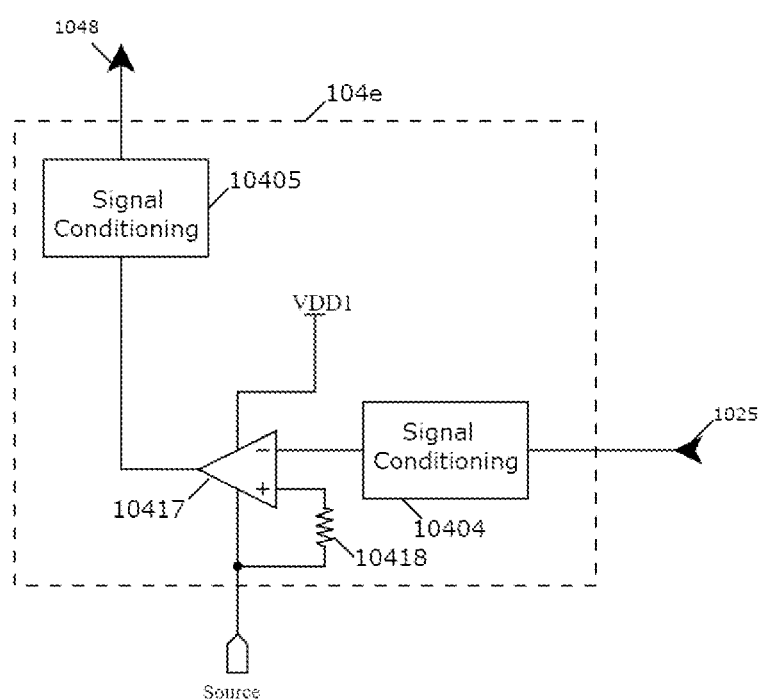
FIGS. 19 to 21 are schematic illustrations of further active stage circuits according to the present disclosure.

The comparator provides a high output when the input voltage (minus signal) node is lower than the reference voltage (plus signal) node and a low output vice versa. In the embodiment illustrated in FIG. 19 the reference voltage is the source bias. When the main HEMT 101 is in reverse conduction mode the sensing circuit will output a negative signal 1025 and therefore the comparator will output a high signal. The active stage output 1048 is similar to the signal provided by the active stage circuit in FIG. 10. As such the active stage in this embodiment may be paired with the gate drive circuits in FIG. 9, FIG. 11, FIG. 12.

Additionally, the active stage circuit 104e may be paired with the gate drive circuit in FIG. 13.

The signal conditioning block 10404 may be used in this embodiment of the active stage circuit to filter or level shift signal 1025 from the sensing circuit. This may be useful in order to avoid false triggering of the active stage circuit when noise or undesirable oscillations are detected at the input of the active stage circuit.

Figure 20:
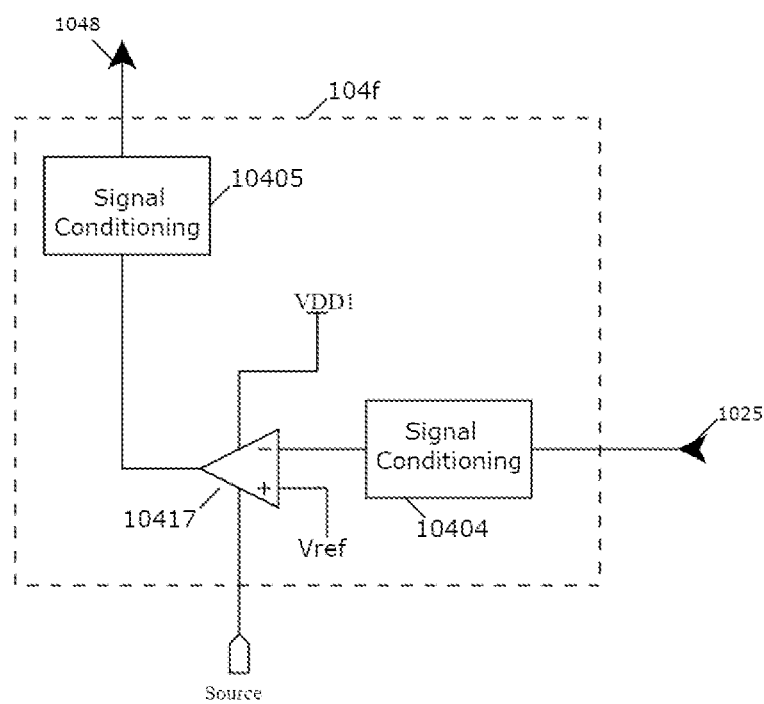

A negative reference voltage may be another option to avoid false triggering. The shift of the reference voltage may be described as an input off-set voltage. This may be done by circuit design within the active stage circuit and based on the implementation of the comparator circuit used. An embodiment with an input off-set voltage is illustrated in FIG. 20.

Figure 21:
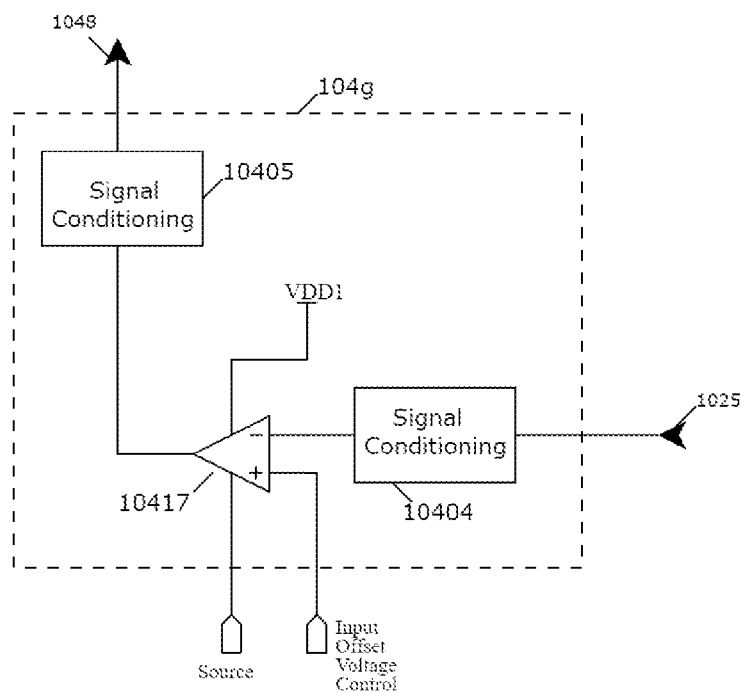

In the embodiment of FIG. 21 the input off-set voltage may be adjusted externally based on the value of a passive component connected to an additional external input. In exemplar embodiments the passive component may be a resistor or a capacitor.

In a second exemplar mode of operation, the GaN chip 110a can sense the voltage on the drain terminal of the GaN HEMT which can be of use in zero voltage switching (ZVS) applications. In this example, sensing the drain to source voltage of a GaN HEMT and using the sense signal such that the potential on the gate terminal of the GaN HEMT is only permitted to rise to the on-state bias range (Vgs=4V and 7V as described above) when the drain to source voltage is low (e.g. zero or 2% of device breakdown rating), allows the designer to simplify the control and increase the efficiency of a system using the device in a ZVS mode.

The embodiment of the sensing circuit illustrated in FIG. 3 may also be suitable for use in this mode of operation of the GaN chip.

be permitted to be actively driven high according to the gate control signal. The active stage should therefore be designed to allow an increase in the main HEMT gate voltage potential when it receives the aforementioned input signal from the sensing circuit.

The required function is as follows:
Sensing output signal high positive→gate of transistor 101 should remain low (e.g. Vgs=0V) irrespective of gate control signal.
Sensing output signal low positive (<Vth), zero or negative→gate of transistor 101 should rise (Vgs>0V) according to gate control signal.

Depending on the gate drive circuit used in the GaN chip an appositely designed active stage circuit can be used.

In some embodiments, the output signal from the active stage circuit may be a voltage signal. In some embodiments, the output signal from the active stage circuit may be a current signal. In some embodiments the output signal from the active stage circuit may be defined as the offering or lack of offering of a low resistance path to ground to the node where the output of the active stage circuit is connected. In some embodiments, the offering or lack of offering of a low resistance path may be understood as a current signal.

Figure 22:
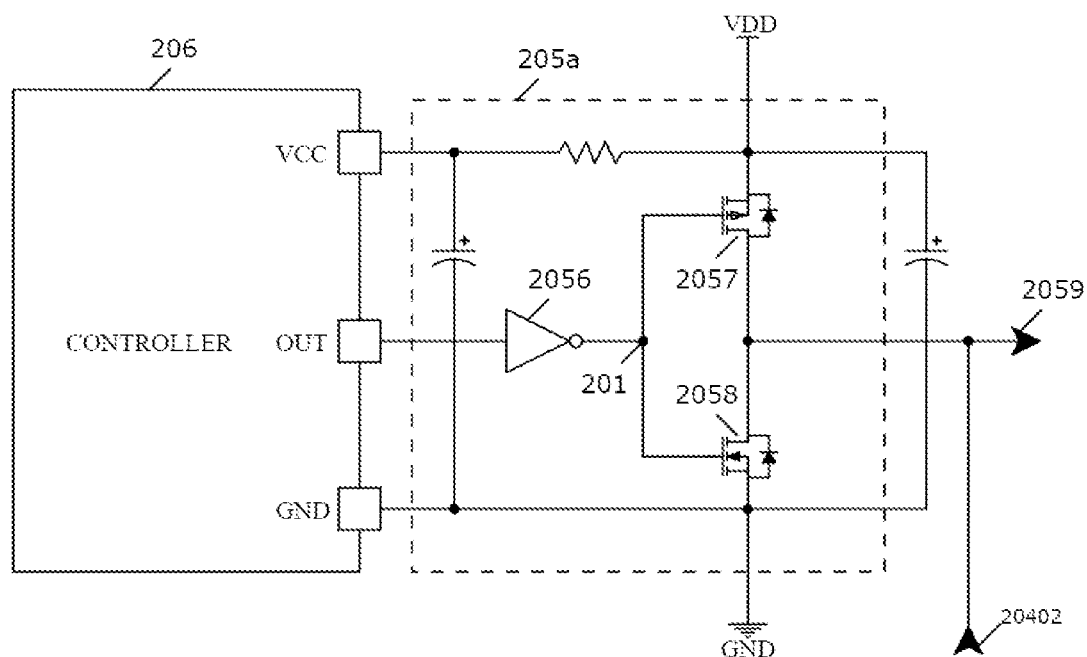
FIG. 22 is a schematic illustration of a gate drive circuit according to the present disclosure.
Figure 23:
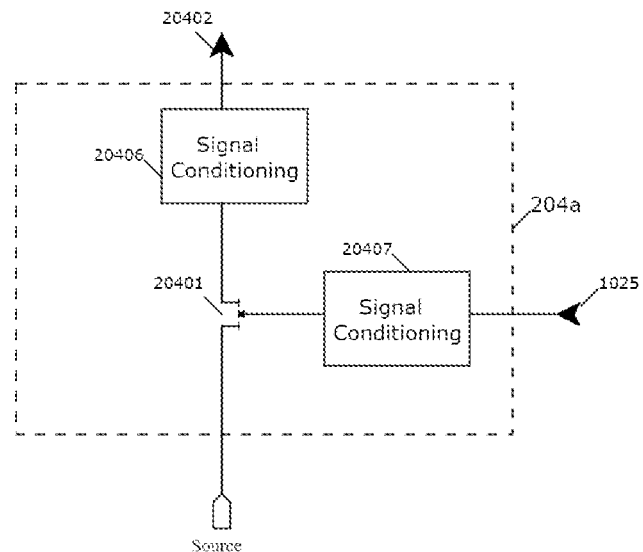
FIG. 23 is a schematic illustration of an active stage circuit according to the present disclosure.

One example of a gate drive circuit/active stage circuit combination is given in FIG. 22 and FIG. 23. Note that the gate drive circuit presented in this example may not be monolithically integrated but rather co-packaged or included in a GaN module arrangement or included at system level (see FIG. 7).

The gate drive circuit 205 given in this example is a MOSFET Totem-pole driver design which comprises an inverter 2056, an enhancement mode NMOS device 1058 and an enhancement mode PMOS device 2057. The gate node 201 of the two MOSFET devices is an inverted signal compared to the signal 2059 that is applied to the gate terminal of the high voltage device 101.

Figure 7:
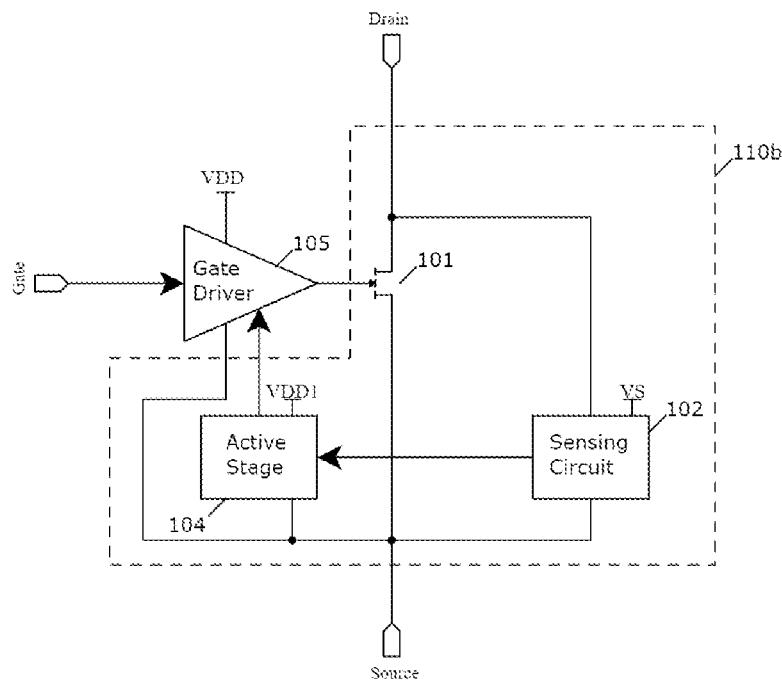
FIG. 7 is a schematic illustration of a circuit in which a gate drive circuit is co-packaged or included in a module arrangement, or included at system level.

The block circuit illustrated in FIG. 2, FIG. 7 can be used to achieve zero voltage switching when the gate drive and active stage combination is used as illustrated in FIG. 22, FIG. 23.

The active stage circuit in this example comprises an enhancement mode transistor 20401 and signal conditioning circuit blocks 20406, 20407.

In some embodiments the signal conditioning circuits may be optional. In some embodiments, the signal conditioning circuit may contain functional blocks such as a buffer, Schmitt trigger, latching circuit, voltage follower, logic gate, inverter, level shifter or similar.

Figure 24:
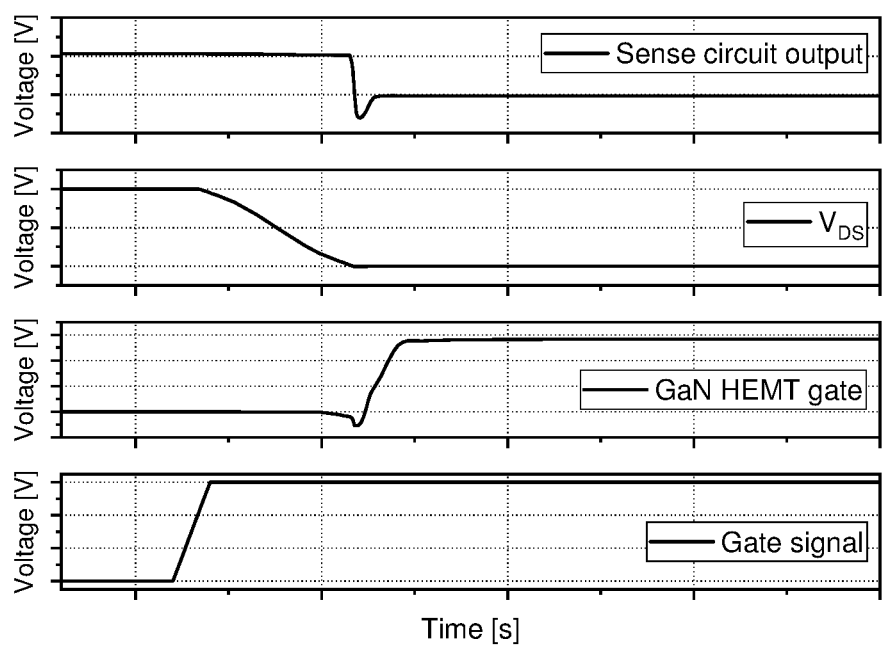
FIG. 24 illustrates a graph of a voltage change with time in a switching event for a sense circuit output, VDS, a GaN HEMT gate, and a gate signal.

The gate terminal of this transistor receives the signal 1025 from the sensing circuit 102. This transistor can only turn-off (and thus allow the gate drive circuit to provide a high signal) when the signal from the sensing circuit is lower than its threshold voltage (for example <1.5V). The high voltage HEMT can therefore only turn-on when the output signal from the sensing circuit is low, i.e. when the high voltage across HEMT 101 is low. Operation in this manner can therefore create a short or negligible overlap of voltage and current through device 101 during a switching event. This is illustrated in FIG. 24. Despite the gate control signal going high, the GaN HEMT gate potential is only allowed to rise when VDS reduces to a voltage close to 0V. The output of the sense circuit and how it relates to VDS is also shown in FIG. 24.

The different conditions of operation are captured in Table 4:

TABLE 4

| Gate Driver input signal from Controller | Active Heterojunction Transistor $V_{DS}$ | Sensing Circuit signal to Active Circuit | Active Stage resistance | Active Heterojunction Transistor $V_{gs}$ |
| --- | --- | --- | --- | --- |
| Low | High positive | High | Low | Low |
| High | High positive | High | Low | Low |
| High | Low positive | Low | High | High |

Figure 25:
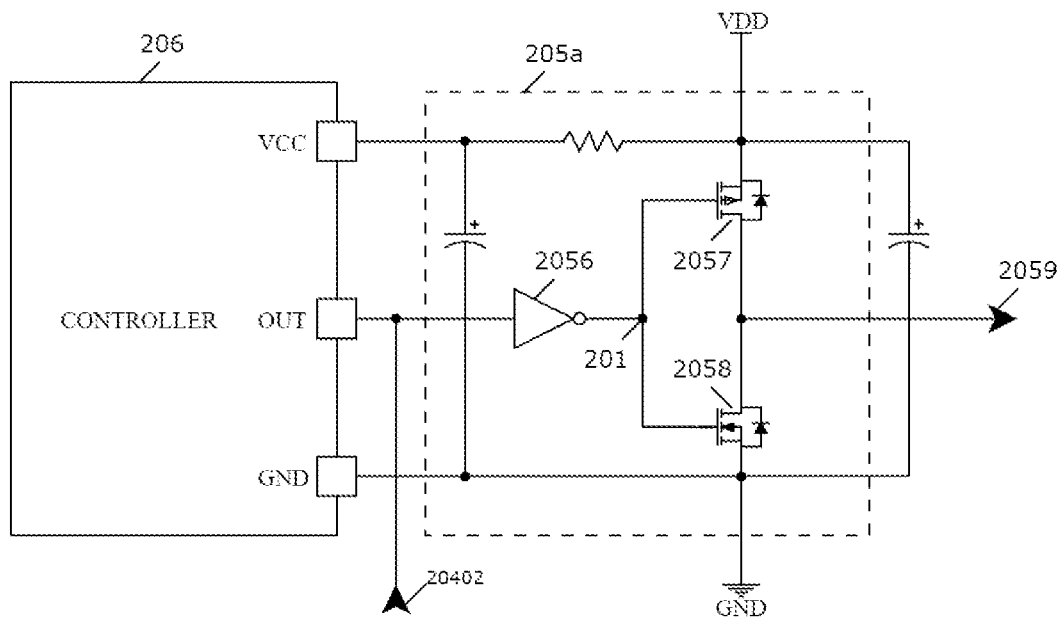
FIGS. 25 and 26 are schematic illustrations of gate drive circuits according to the present disclosure.

In another embodiment illustrated in FIG. 25 the active stage circuit is connected to the input of the gate driver rather than the output of the gate driver. The active stage circuit in FIG. 23 may still be paired with the gate drive circuit illustrated in this embodiment.

Embodiments shown in FIG. 22 and FIG. 25 may result in significant losses in the drive circuit as the gate driver current (FIG. 22) or controller output current (FIG. 25) is sunk to ground when the active stage circuit provides a low resistance path under certain conditions.

In another embodiment, not illustrated here, signal 20402 could be connected to the control terminal of a transistor switch circuit placed in series with the input or output of the gate driver. This may result in reduced gate driver losses compared to the examples shown in FIG. 22 and FIG. 25.

Figure 26:
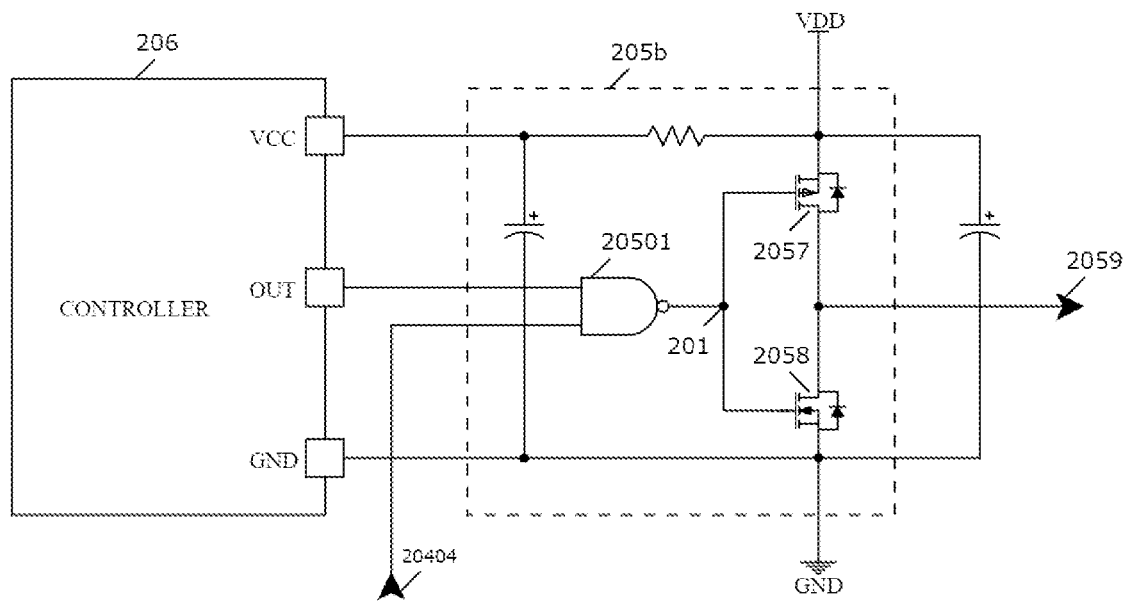
Figure 27:
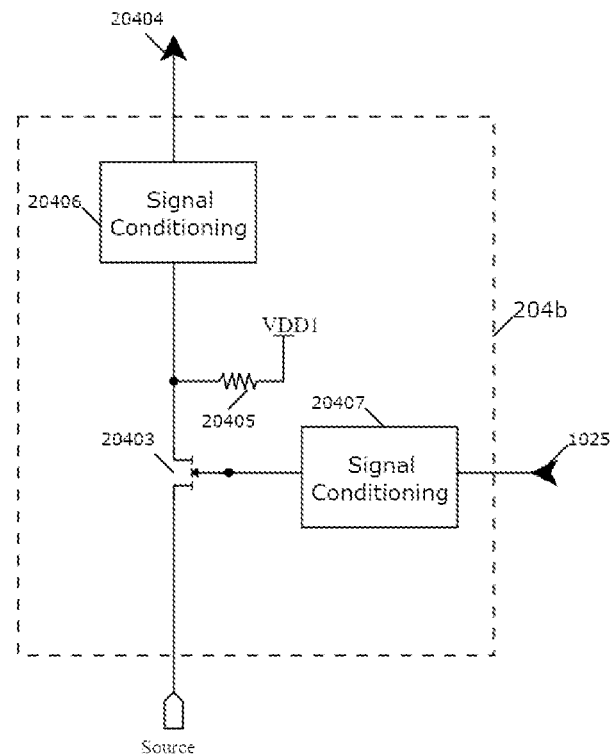
FIG. 27 is a schematic illustration of an active stage circuit according to the present disclosure.

Another combination of a gate drive circuit and an active stage circuit which enables zero voltage switching, is illustrated in FIG. 26, FIG. 27. The active stage circuit in FIG. 27 comprises an enhancement mode HEMT 20403, a resistor 20405, two optional signal conditioning circuit blocks 20406, 20407 and a voltage rail VDD1. The voltage rail may be applied externally or generated on the GaN chip IC. The resistor 10405 may be replaced by a current source or an active pull-up circuit.

In another embodiment, the common source amplifier configuration illustrated in FIG. 27 could be replaced with a common gate amplifier configuration.

The gate drive circuit comprises a NAND gate 20501 with two inputs. One input is the control signal and the second input is the voltage signal 20404 from the active stage circuit.

Figure 28:
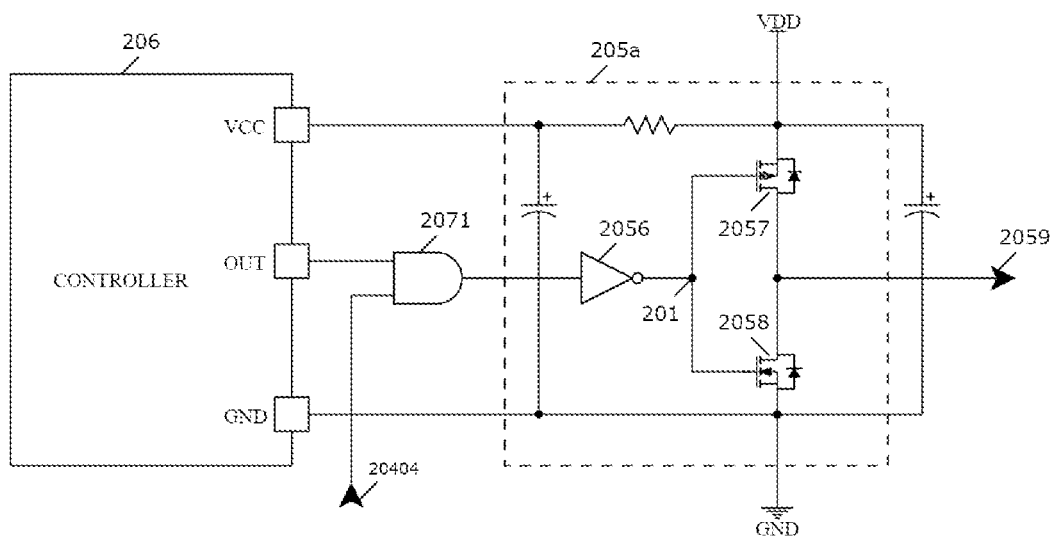
FIGS. 28 and 29 are schematic illustrations of gate drive circuits according to the present disclosure.

In another embodiment the configuration in FIG. 26 could be replaced with the configuration in FIG. 28. In this embodiment an AND gate outside the gate drive circuit 205a is included. This AND gate is placed between the controller and the gate drive circuit. The AND gate has two inputs, the control signal from the controller and the signal 20404 from the active stage circuit in FIG. 27.

Figure 29:
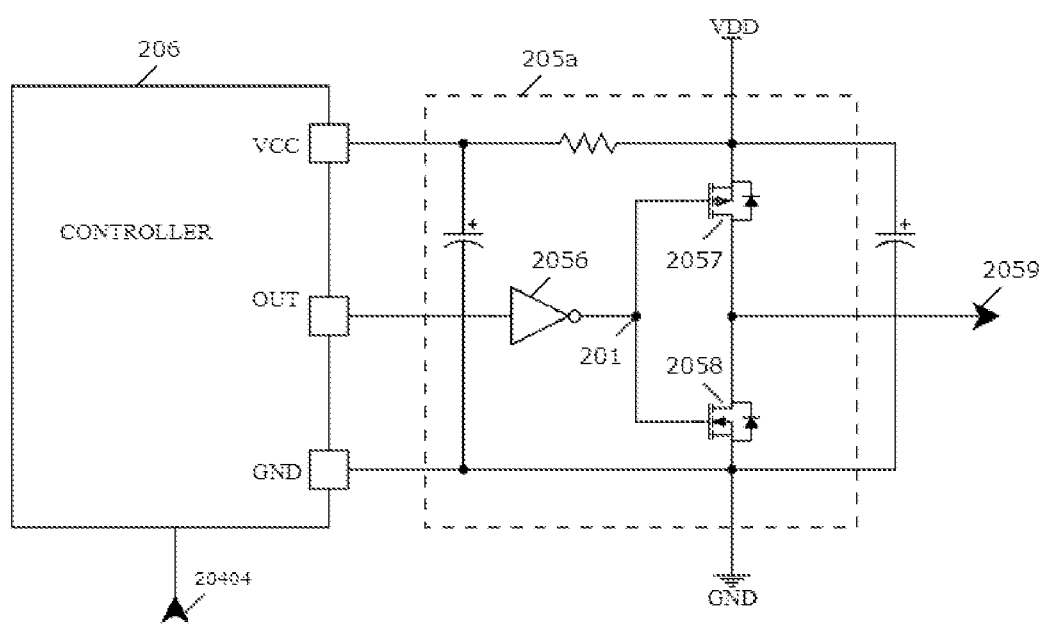

In another embodiment, the active stage circuit signal 20404 could be applied to the controller as illustrated in FIG. 29.

Figure 30:
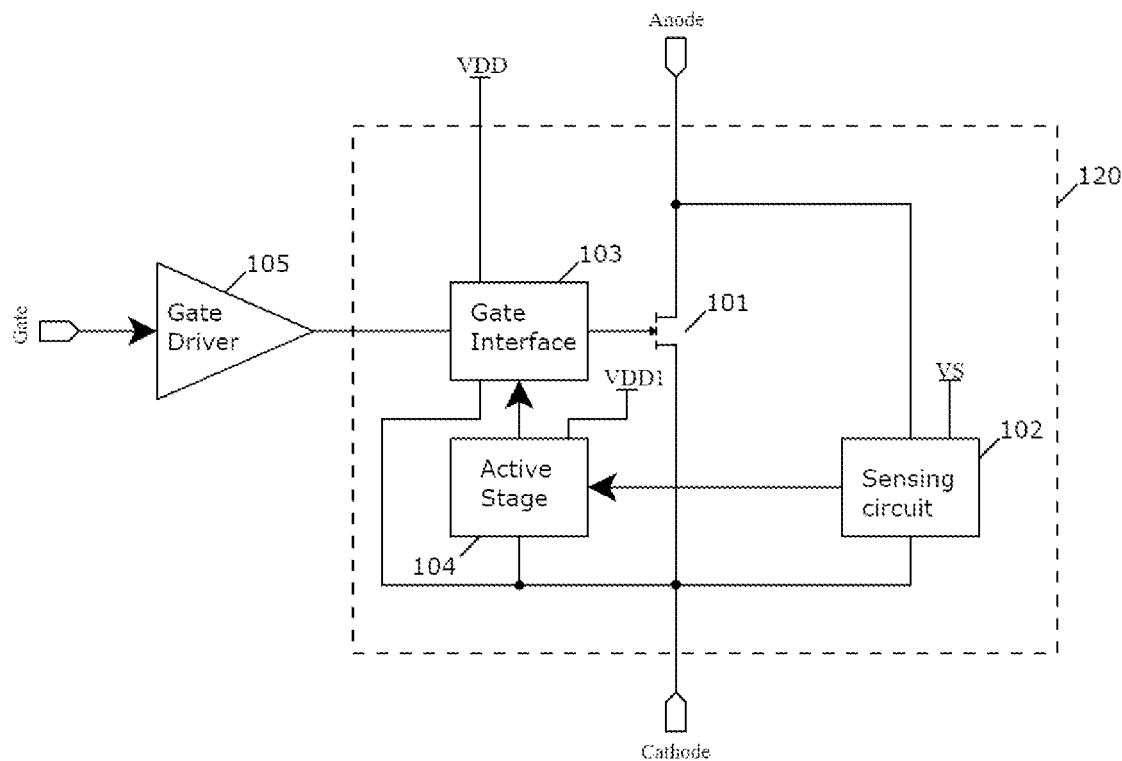
FIG. 30 is a schematic illustration of a gate drive circuit/active stage circuit combination according to the present disclosure.
Figure 31:
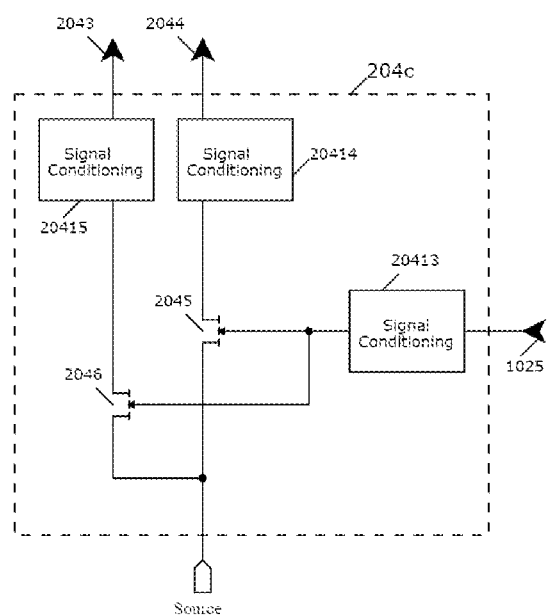
FIGS. 31 and 32 are schematic illustrations of active stage circuits according to the present disclosure.
Figure 33:
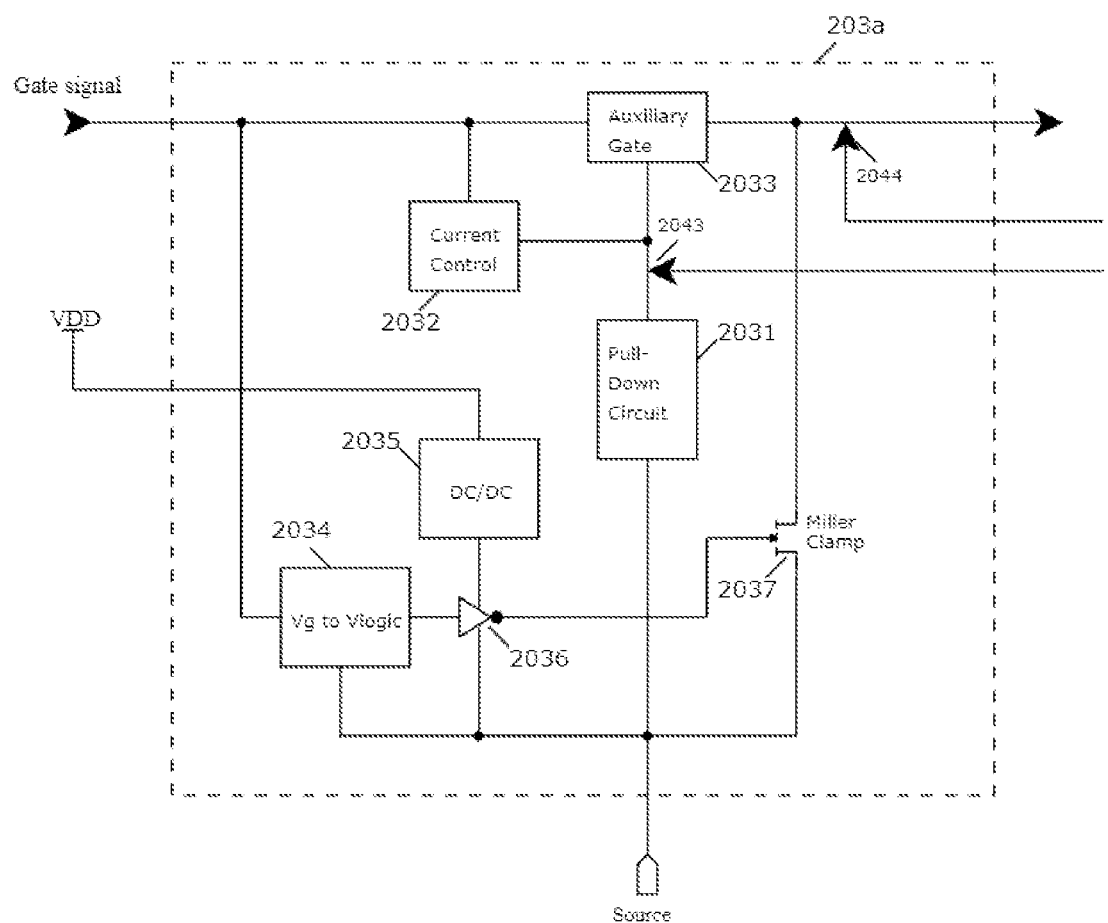
FIG. 33 is a schematic illustration of the various circuit blocks of a gate drive interface according to the present disclosure.

Another example of a gate drive circuit/active stage circuit combination is given in FIG. 30, FIG. 31, FIG. 33.

The example in FIG. 30 illustrates an additional example of how the setup can be utilized to allow zero voltage switching. In this example the device 120 can comprise a gate drive interface 103 rather than an integrated gate driver. The gate drive interface described in this example is outlined in detail in patent application US patent publication no. US 2021/0335781 A1 and International Patent publication no. WO 2020/225362 A1, both of which are hereby incorporated by reference. The building blocks of the gate drive interface are illustrated in FIG. 33. The gate drive interface comprises an auxiliary gate circuit block 2033, a current control block 2032, a pull-down circuit block 2031, a DC/DC converter 2035, a Miller clamp 2037, a logic inverter 2036 and a Vg to Vlogic circuit block 2034.

The active stage in this example comprises two enhancement mode transistors 2045 and 2046, and three optional signal conditioning circuit blocks 20413, 20414, 20415.

The gate terminal of these transistors receives the signal 1025 from the sensing circuit 102. These transistors can only turn-off (and thus allow the high voltage HEMT to turn-on) when the signal from the sensing circuit is lower than the enhancement mode transistor threshold voltage. The high voltage HEMT can therefore only turn-on when the output signal from the sensing circuit is low i.e. when the high voltage across HEMT 101 is low creating a short or negligible overlap of voltage and current through device 101 during a switching event.

The different conditions of operation are equivalent therefore to those captured in Table 4.

Figure 34:
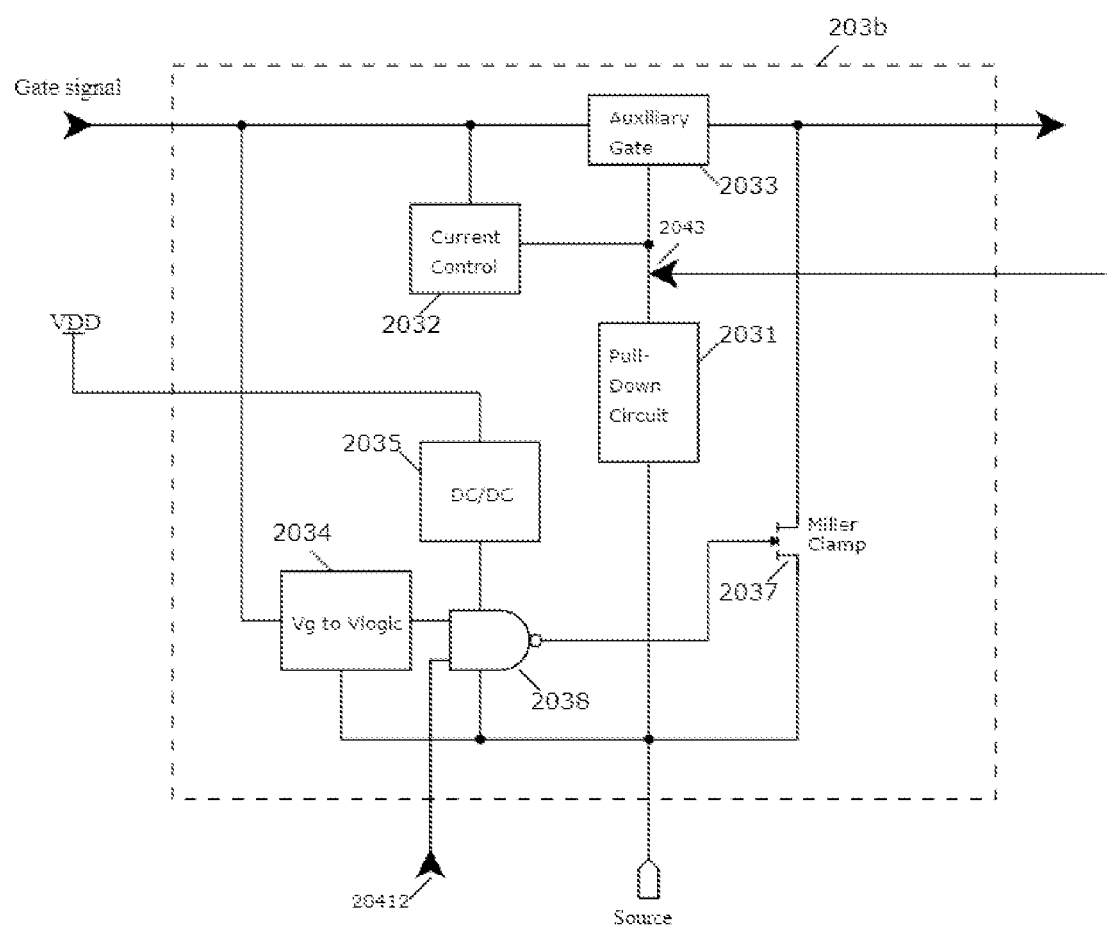
FIG. 34 is a schematic illustration of an example gate drive interface circuit according to the present disclosure.
Figure 35:
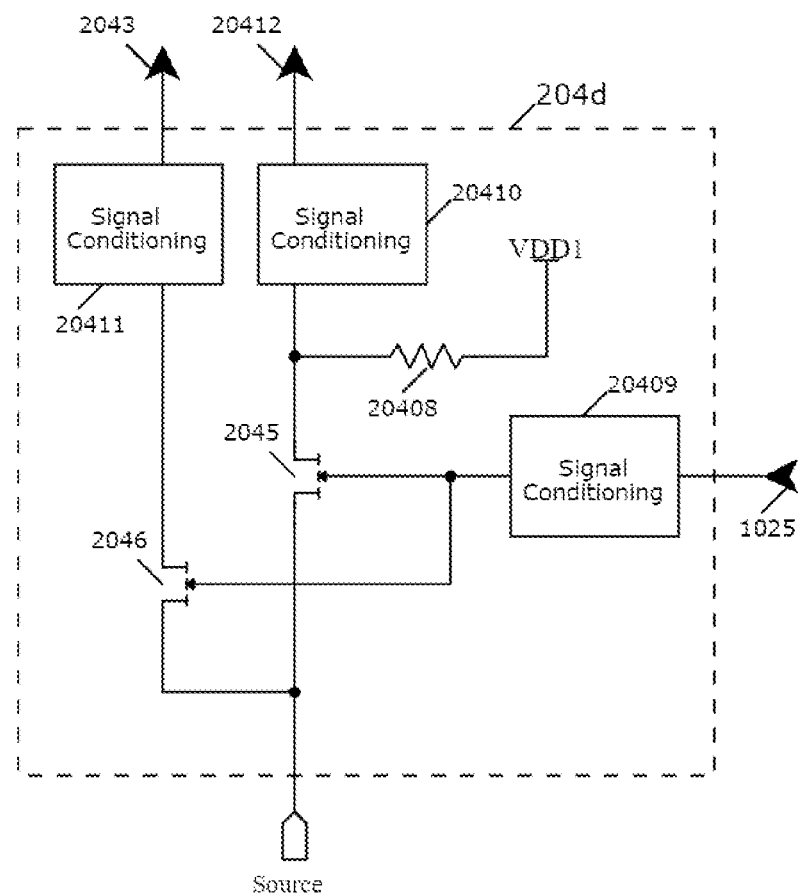
FIG. 35 is a schematic illustration of an active stage circuit according to the present disclosure.

In another embodiment, the active stage/gate drive interface circuit in FIG. 34, FIG. 35 may be used.

The gate drive interface circuit 203b in FIG. 34 is similar to the gate drive interface illustrated in FIG. 33 but contains a NAND gate 2038 rather than an inverter circuit 2036. One of the inputs of the NAND gate is a voltage signal form the active stage circuit 20412.

The active stage circuit 204d in FIG. 35 comprises two enhancement mode transistors 1045, 1046, three optional signal conditioning blocks 20409, 20410, 20411, a resistor 20408 and a voltage rail VDD1. The voltage VDD1 could be generated on the GaN chip or applied externally. The resistor 20408 may be replaced by a current source or an active pull-up circuit.

The ability to overrule the ZVS functionality in order to allow hard switching is necessary in certain applications. Therefore, some variations of the embodiments illustrated can contain such an enable/disable function. This function may be placed in the sensing circuit as in FIG. 4, in the active stage circuit as in FIG. 32 or the gate drive interface circuit as illustrated in FIG. 36.

The sensing circuit of FIG. 4 comprises an additional enhancement mode transistor 1026 compared to the circuit in FIG. 3. The control terminal of transistor 1026 is described as the enable/disable input. The signal for this input may be applied externally or generated on the GaN IC. In this example when the enable/disable signal is high (>Vth) the ZVS function is overruled as the output of the sensing circuit is zero regardless of the voltage across the terminals of the main HEMT 101.

Figure 32:
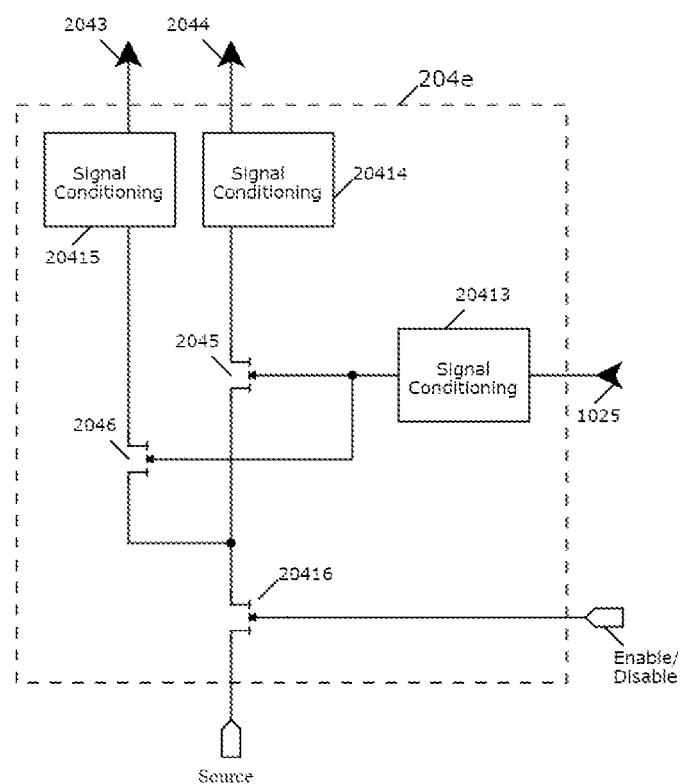

The active stage circuit of FIG. 32 comprises an additional enhancement mode transistor 20416 compared to the circuit in FIG. 31. The control terminal of transistor 20416 is described as the enable/disable input. The signal for this input may be applied externally or generated on the GaN IC. In this example when the enable/disable signal is low (<Vth) the ZVS function is overruled. This is due to that, regardless of the input signal from the sensing circuit 1025, the resistance of the active stage circuit will be high. Therefore, the active stage circuit cannot provide a low resistance path (alternatively described as a high current signal) to the nodes where active stage circuit outputs 2043 and 2044 are connected. Alternatively, a transistor connected to the gates of transistors 2045 and 2046 may be used to disable and enable the function.

Figure 36:
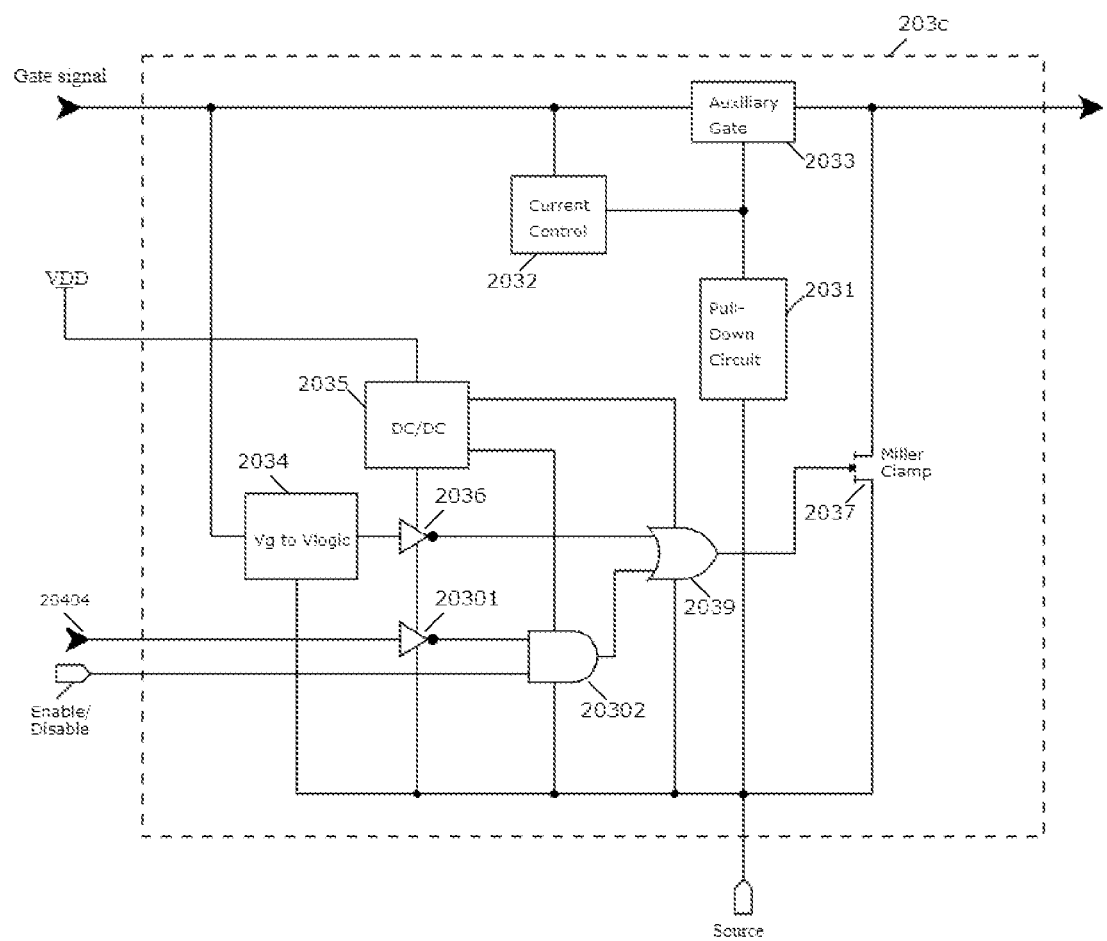
FIG. 36 is a schematic illustration of an example gate drive interface circuit according to the present disclosure.

The gate drive interface circuit of FIG. 36 comprises additional logic gates 2039, 20301 and 20302 compared to the circuit in FIG. 34. An additional input (enable/disable) is included in this embodiment. The active stage signal is signal 20404 as illustrated in FIG. 27. In this embodiment, the ZVS function is enabled when the enable/disable input is high and the ZVS function is disabled when the input is low.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives. These terms are used for ease of reference but are not intended to be of limiting nature.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

REFERENCES

[1] U. K. Mishra et al., GaN— Based RF power devices and amplifiers, Proc. IEEE, vol 96, no 2, pp 287-305, 2008.
[2] M. H. Kwan et al, CMOS-Compatible GaN-on-Si Field-Effect Transistors for High Voltage Power Applications, IEDM, San Fran., December 2014, pp 17.6.1-17.6.4
[3] S. Lenci et al., Au—free AlGan/GaN power diode 8-in Si substrate with gated edge termination, Elec. Dev. Lett., vol 34, no 8, pp 1035, 2013.
[4] T. Oka and T. Nozawa, IEEE Electron Device Lett., 29, 668 (2008).
[5] Y. Cai, Y. Zhou, K. J. Chen, and K. M. Lau, IEEE Electron Device Lett., 26, 435 (2005)
[6] W. Saito, Y. Takada, M. Kuraguchi, K. Tsuda, and I. Omura, IEEE Trans. Electron Devices, 53, 356, (2006).
[7] Y. Uemoto, M. Hikita, H. Ueno, H. Matsuo, H. Ishida, M. Yanagihara, T. Ueda, T. Tanaka, and D. Ueda, IEEE Trans. Electron Devices, 54, 3393 (2007).
[8] I. Hwang, H. Choi, J. Lee, H. S. Choi, J. Kim, J. Ha, C. Y. Um, S. K. Hwang, J. Oh, J. Y. Kim, J. K. Shin, Y. Park, U. I. Chung, I. K. Yoo, and K. Kim, Proc. ISPSD, Bruges, Belgium, p.41 (2012).

The invention claimed is:

1. A III-nitride power semiconductor based heterojunction device comprising a first terminal, a second terminal and a control terminal and further comprising a substrate and an active heterojunction transistor formed on a substrate, the active heterojunction transistor comprising:
   a III-nitride semiconductor region comprising a heterojunction comprising an active two dimensional carrier gas;
   a source terminal operatively connected to the III-nitride semiconductor region and further connected to the first terminal;
   a drain terminal laterally spaced from the first terminal and operatively connected to the III-nitride semiconductor region, and further connected to the second terminal;
   an active gate region formed over the III-nitride semiconductor region and between the first terminal and the second terminal; and
   an internal gate terminal operatively connected to the active gate region;
   the III-nitride power semiconductor based heterojunction device further comprising:
   a gate drive circuit connected to the control terminal and further connected to the internal gate terminal of the active heterojunction transistor, the gate drive circuit being configured to provide a driving signal to the internal gate terminal of the active heterojunction transistor;
   a sensing circuit connected to the drain terminal of the active heterojunction transistor, and further connected to the first terminal, the sensing circuit being configured to sense a current and/or voltage at the drain terminal of the active heterojunction transistor and to generate an output signal; and
   an active stage circuit connected to the sensing circuit, and further connected to the gate drive circuit and to the source terminal of the active heterojunction transistor, the active stage circuit being configured to receive the output signal from the sensing circuit, and further configured to cause the gate drive circuit to adjust the driving signal based on the output signal from the sensing circuit;
   wherein, in use, when the active heterojunction transistor is in a forward conducting state, the first terminal is a low voltage terminal and the second terminal is a high voltage terminal; and
   wherein, when the active heterojunction transistor is in a reverse conducting state, the first terminal is a high voltage terminal and the second terminal is a low voltage terminal.

2. A III-nitride power semiconductor based heterojunction device according to claim 1, wherein the gate drive circuit is further configured to actively drive the internal gate terminal of the active heterojunction transistor when the sensing circuit senses a voltage at the drain terminal of the active heterojunction transistor relative to the source terminal of the active heterojunction transistor that is below a zero signal voltage.

3. A III-nitride power semiconductor based heterojunction device according to claim 2, wherein the active heterojunction transistor has an associated device breakdown rating voltage, and wherein the zero signal voltage has a maximum value of about 2% of the device breakdown rating voltage.

4. A III-nitride power semiconductor based heterojunction device according to claim 1, wherein, the active heterojunction transistor has an associated threshold voltage; and wherein:
when the sensing circuit senses a reverse current between the first terminal and second terminal, the output signal from the sensing circuit is configured to cause the active stage circuit to adjust the driving signal of the gate drive circuit to increase an internal gate terminal voltage above a threshold voltage of the active heterojunction transistor.

5. A III-nitride power semiconductor based heterojunction device according to claim 1, wherein the sensing circuit comprises: a sensing high voltage, low power enhancement mode heterojunction transistor in series with a resistive or non-linear element; and
wherein the drain terminal of the sensing high voltage, low power enhancement mode heterojunction transistor is operatively connected to the second terminal of the III-nitride power semiconductor based heterojunction device; and
wherein the resistive or non-linear element comprises one or more resistors, capacitors, current sources and/or diodes.

6. A III-nitride power semiconductor based heterojunction device according to claim 5, wherein the sensing circuit further comprises one or more additional transistors, the one or more additional transistors configured as an active enable/disable function.

7. A III-nitride power semiconductor based heterojunction device according to claim 5, wherein the sensing circuit further comprises an output stage, wherein the output signal is output via the output stage of the sensing circuit; and
wherein a further enhancement mode transistor is configured between the output stage and the first terminal;
wherein a gate of the further enhancement mode transistor is operable via an enable/disable signal.

8. A III-nitride power semiconductor based heterojunction device according to claim 1, wherein the sensing circuit comprises a sensing high voltage, low power depletion mode heterojunction transistor; and
wherein the drain terminal of the sensing high voltage, low power depletion mode heterojunction transistor is operatively connected to the second terminal of the III-nitride power semiconductor based heterojunction device.

9. A III-nitride power semiconductor based heterojunction device according to claim 1, wherein an output stage of the sensing circuit, or input or output stages of the active stage circuit, comprises additional functional or signal conditioning blocks; and
wherein the functional or signal conditioning blocks are configured to operate as one or more of: an amplifier, a buffer, a Schmitt trigger, a latching circuit, a voltage follower, a logic gate, an inverter, a level shifter, and/or a filter.

10. A III-nitride power semiconductor based heterojunction device according to claim 1, wherein the active stage circuit comprises:
at least one depletion mode HEMT and/or enhancement mode HEMT; or
a plurality of depletion mode and/or enhancement mode HEMTs in series or in parallel.

11. A III-nitride power semiconductor based heterojunction device according to claim 1, wherein the active stage circuit comprises a differential amplifier, comparator or an amplifier in a common source arrangement or in a common gate arrangement.

12. A III-nitride power semiconductor based heterojunction device according to claim 1, wherein the signal from the active stage circuit is applied as an input to a controller, a gate drive and/or a gate drive interface, and wherein the signal is in the form of current or voltage.

13. A III-nitride power semiconductor based heterojunction device according to claim 1, wherein the active stage circuit is configured to have an input offset voltage; and wherein the active stage circuit comprises an additional input, and wherein the input offset voltage is configurable by adjustment of parameters of internal or external passive components connected to the additional input.

14. A III-nitride power semiconductor based heterojunction device according to claim 13, further comprising a comparator, wherein the comparator comprises at least a reference voltage node and an input voltage node; and
wherein the input offset voltage is configurable as a reference voltage to said comparator; and wherein the output signal from the sensing circuit is configured as an input voltage to said comparator; and
wherein the adjustable input off-set voltage is configured to avoid false triggering of the active stage circuit when noise or undesirable oscillations are detected at the input of the active stage circuit.

15. A III-nitride power semiconductor based heterojunction device according to claim 13, further comprising a comparator, and a signal conditioning block, wherein the comparator comprises at least a reference voltage node and an input voltage node; and
wherein the input offset voltage is configurable as a reference voltage to said comparator; and wherein the output signal from the sensing circuit is configured as an input voltage to said comparator; and
wherein the signal conditioning block is configured to avoid false triggering of the active stage circuit when noise or undesirable oscillations by filtering and/or level shifting the output signal from the sensing circuit.

16. A III-nitride power semiconductor based heterojunction device according to claim 1, wherein the active stage circuit is configured to output a voltage signal between 0V and a fixed voltage, wherein said fixed voltage is either internally generated or externally applied, and wherein said voltage signal is configured to cause the gate drive circuit to adjust the driving signal.

17. A III-nitride power semiconductor based heterojunction device according to claim 1, wherein the active stage circuit is configured to provide an input to an external controller.

18. A III-nitride power semiconductor based heterojunction device according to claim 1, wherein the gate drive circuit comprises a MOSFET Totem pole driver.

19. A III-nitride power semiconductor based heterojunction device according to claim 1, wherein a gate drive interface circuit is connected between the gate drive circuit and the active heterojunction transistor.

20. A III-nitride power semiconductor based heterojunction device according to claim 1, wherein a gate drive interface circuit is disposed between a controller and the gate drive circuit.

21. A III-nitride power semiconductor based heterojunction device according to claim 1, wherein two or more of the active heterojunction transistor, the gate drive circuit, the sensing circuit, and the active stage circuit are monolithically integrated with one another.

22. A III-nitride power semiconductor based heterojunction device comprising a first terminal, a second terminal and a control terminal and further comprising a substrate and an active heterojunction transistor formed on a substrate, the active heterojunction transistor comprising:

- a III-nitride semiconductor region comprising a heterojunction comprising an active two dimensional carrier gas;
- a source terminal operatively connected to the III-nitride semiconductor region and further connected to the first terminal;
- a drain terminal laterally spaced from the first terminal and operatively connected to the III-nitride semiconductor region, and further connected to the second terminal;
- an active gate region formed over the III-nitride semiconductor region and between the first terminal and the second terminal; and
- an internal gate terminal operatively connected to the active gate region;

the III-nitride power semiconductor based heterojunction device further comprising:

- a gate drive interface circuit connected to the control terminal and further connected to the internal gate terminal of the active heterojunction transistor, the gate drive interface circuit being configured to provide a driving signal to the internal gate terminal of the active heterojunction transistor;
- a sensing circuit connected to the drain terminal of the active heterojunction transistor, and further connected to the first terminal, the sensing circuit being configured to sense a current and/or voltage at the drain terminal of the active heterojunction transistor and to generate an output signal; and
- an active stage circuit connected to the sensing circuit, and further connected to the gate drive interface circuit and to the source terminal of the active heterojunction transistor, the active stage circuit being configured to receive the output signal from the sensing circuit, and further configured to cause the gate drive interface circuit to adjust the driving signal based on the output signal from the sensing circuit;

wherein, in use, when the active heterojunction transistor is in a forward conducting state, the first terminal is a low voltage terminal and the second terminal is a high voltage terminal; and wherein, when the active heterojunction transistor is in a reverse conducting state, the first terminal is a high voltage terminal and the second terminal is a low voltage terminal.

* * * * *